(12) United States Patent
Uda

(10) Patent No.: US 6,839,014 B2
(45) Date of Patent: Jan. 4, 2005

(54) ONE-CHIP MICROCOMPUTER WITH ANALOG-TO-DIGITAL CONVERTER

(75) Inventor: Nobuya Uda, Hyogo (JP)

(73) Assignees: Renesas Technology Corp., Tokyo (JP); Mitsubishi Electric System LSI Design Corporation, Itami (JP)

( * ) Notice: Subject to any disclaimer, the term of this patent is extended or adjusted under 35 U.S.C. 154(b) by 88 days.

(21) Appl. No.: 10/141,118

(22) Filed: May 9, 2002

(65) Prior Publication Data

US 2003/0001763 A1 Jan. 2, 2003

(30) Foreign Application Priority Data

Jun. 27, 2001 (JP) ........................................ 2001-195008

(51) Int. Cl.$^7$ ............................................... H03M 1/12
(52) U.S. Cl. ...................................... 341/155; 341/159
(58) Field of Search ................................. 341/155, 159, 341/122

(56) References Cited

U.S. PATENT DOCUMENTS

| | | | |
|---|---|---|---|
| 4,047,883 A | * 9/1977 | Waters | 432/14 |
| 4,340,883 A | * 7/1982 | Cook | 341/127 |
| 4,947,106 A | * 8/1990 | Chism | 324/73.1 |
| 5,444,459 A | * 8/1995 | Moriyasu | 345/440.1 |
| 6,057,795 A | * 5/2000 | Suzuki | 341/155 |
| 6,075,478 A | * 6/2000 | Abe | 341/155 |

FOREIGN PATENT DOCUMENTS

| | | |
|---|---|---|
| DE | 38 52 928 T2 | 1/1995 |
| DE | 696 01 633 T2 | 11/1999 |
| EP | 0 318 055 B1 | 2/1995 |
| EP | 0 832 517 B1 | 3/1999 |
| JP | 05-053706 | 3/1993 |

OTHER PUBLICATIONS

Data Sheet of MN101C485, MN101C487, Pana X Series, published by Matsushita Electric Industrial Co., Ltd. et al., Feb. 2001, p 41–47.

LSI Description, Pana X Series, published by Matsushita Electric Industrial Co., Ltd. et al., Feb. 2001, p 1–5.

* cited by examiner

*Primary Examiner*—Peguy JeanPierre
(74) *Attorney, Agent, or Firm*—Burns, Doane, Swecker & Mathis, L.L.P.

(57) ABSTRACT

An input circuit of a one-chip microcomputer is connected to an external switching circuit. When an analog input signal of a significant level generated in the external switching circuit is received at an analog input terminal of the input circuit, an A/D conversion start request signal is generated in an A/D conversion start request generating circuit and is sent to an A/D converter. The operation of the A/D converter is started in response to the A/D conversion start request signal, the analog input signal received at the analog input terminal is converted into digital data, and an A/D conversion finish signal is sent from the A/D converter to a CPU of the one-chip microcomputer. The operation of the CPU is started in response to the A/D conversion finish signal, and the digital data is readout to the CPU. Therefore, the A/D converter, the CPU or a clock is not operated to wait for an analog input signal generated in the external switching circuit, but the A/D converter is operated for the A/D conversion, and the CPU is operated to read out the digital data. Accordingly, an electric power consumed in the A/D converter, the CPU and the clock can be reduced.

10 Claims, 11 Drawing Sheets

ONE-CHIP MICROCOMPUTER WITH ANALOG-TO-DIGITAL CONVERTER

BACKGROUND OF THE INVENTION

1. Field of the Invention

The present invention relates to a one-chip microcomputer with an analog-to-digital converter in which a large number of analog signals generated one after another in an external switching circuit are received at a small number of terminals and are recognized.

2. Description of Related Art

In cases where a large number of analog signals are input one after another to a plurality of input terminals of a one-chip microcomputer, a key matrix type circuit or an analog-to-digital (A/D) converter is used as an input circuit of the one-chip microcomputer. In case of the key matrix type input circuit, in cases where the number of input terminals of the one-chip microcomputer is equal to or higher than two and is the same as the number of output terminals of the one-chip microcomputer, a large number of analog signals input one after another to the one-chip microcomputer can be most efficiently recognized.

FIG. 9 is a circuit view showing a conventional one-chip microcomputer with a key matrix type input circuit. In FIG. 9, 1 indicates a conventional one-chip microcomputer. P00 to P03 indicate a plurality of input terminals of the conventional one-chip microcomputer 1. P20 to P23 indicate a plurality of output terminals of the conventional one-chip microcomputer 1. 2a to 2d indicate a plurality of input signal lines connected to the input terminals P00 to P03. 3a to 3d indicate a plurality of output signal lines connected to the output terminals P20 to P23. 4a to 4p indicate a plurality of switches respectively connecting one input signal line and one output signal line. An off-state of each switch is set to an on-state when a user pushes down a key.

FIG. 10 is a timing chart showing an operation performed in the conventional one-chip microcomputer 1 with the key matrix type input circuit.

Next, an operation of the conventional one-chip microcomputer 1 with the key matrix type input circuit will be described with reference to FIG. 10.

As shown in FIG. 10, each of the input terminals P00 to P03 and the output terminals P20 to P23 is pulled up to a high ("H") level in advance by the conventional one-chip microcomputer 1, and all the switches are initially set to an off-state. Thereafter, a low ("L") level signal is cyclically output from the conventional one-chip microcomputer 1 to each of the output terminals P20 to P23 in time sharing. In cases where a specific switch is set to an on-state to input an analog signal to the conventional one-chip microcomputer 1 through the specific switch, when the L level signal is output to a specific output terminal connected to the specific switch through a specific output signal line, the H level of a specific input terminal connected to the specific switch through a specific input signal line is lowered to the L level. Therefore, it is judged in the conventional one-chip microcomputer 1 that the specific switch connecting the specific input terminal and the specific output terminal is set in the on-state.

In the example shown in FIG. 10, the switch 4b is set in the on-state during an on-time period of the switch 4b to input an analog signal to the conventional one-chip microcomputer 1 through the switch 4b. When the L level signal is output to the output terminal P21 within the on-time period of the switch 4b, because the output signal line 3b connected to the output terminal P21 is connected to the input signal line 2a connected to the input terminal P00 through the switch 4b set in the on-state, the H level of the input terminal P00 is lowered to the L level. Therefore, it is judged in the conventional one-chip microcomputer 1 that the switch 4b is set in the on-state.

Accordingly, because the output of the L level signal to each of the output terminals P20 to P23 is cyclically performed under control of the conventional one-chip microcomputer 1, the input of an analog signal through a switch set in the on-state can be recognized in the conventional one-chip microcomputer 1 according to the combination of the output terminal, from which the L level signal is output, and the input terminal in which the L level signal is received in simultaneous with the output of the L level signal. Therefore, because a plurality of switches are arranged in the key matrix type input circuit connected to the input and output terminals of the conventional one-chip microcomputer 1, a large number of analog signals input to the conventional one-chip microcomputer 1 can be recognized by arranging a small number of input and output terminals.

In the conventional one-chip microcomputer 1 with the key matrix type input circuit shown in FIG. 9, the number of input terminals is four, and the number of output terminals is four. Therefore, each of sixteen analog signals input through sixteen switches respectively can be recognized in the conventional one-chip microcomputer 1.

However, in the conventional one-chip microcomputer 1 with the key matrix type input circuit, to operate the conventional one-chip microcomputer 1 by using sixteen keys corresponding to sixteen switches, it is required to arrange eight terminals (four input terminals and four output terminals) in the conventional one-chip microcomputer 1. Therefore, in cases where the number of terminals attached to the conventional one-chip microcomputer is small, there is a case where the number of switches possible to be arranged in the key matrix type input circuit is lower than that required for the conventional one-chip microcomputer. As a result, it is inconvenient to use the key matrix type input circuit for the conventional one-chip microcomputer.

Next, an example of the inputting of a plurality of analog signals through an A/D converter arranged in a conventional one-chip microcomputer is described.

FIG. 11 is a circuit view showing a conventional one-chip microcomputer with an A/D converter connected to an external switching circuit. In FIG. 11, 5 indicates each of a plurality of resistors which are arranged in an external switching circuit connected to the conventional one-chip microcomputer 1. The resistors 5 have the same resistance. 6a to 6d indicate switches arranged in the external switching circuit. One end of each switch is connected to a low level terminal set to Vss. Each of the switches 6a to 6d is set in an off-state when no user's switching operation is performed for the switch. In the conventional one-chip microcomputer 1, 7 indicates an analog input terminal, 8 indicates an A/D converter, 9 indicates a signal line of an A/D conversion start request signal ADSTART, 10 indicates a data bus, and 11 indicates a signal line of an A/D conversion finish signal ADF. The analog input terminal is set to the H level (Vcc) when no switch is set to the off-state.

Next, an operation of the conventional one-chip microcomputer 1 having the A/D converter 8 will be described below.

Four resistors 5 are arranged between the switch 6a and the analog input terminal 7. Therefore, when the switch 6a is set to an on-state, a level of the analog input terminal 7 is set to a first level lower than the H level Vcc. Two resistors 5 are arranged between the switch 6b and the analog input terminal 7. Therefore, when the switch 6b is set to an on-state, a level of the analog input terminal 7 is set to a second level lower than the first level. One resistor 5 is arranged between the switch 6c and the analog input terminal 7. Therefore, when the switch 6c is set to an on-state, a level of the analog input terminal 7 is set to a third level lower than the second level. No resistor is arranged between the switch 6d and the analog input terminal 7. Therefore, when the switch 6d is set to an on-state, a level of the analog input terminal 7 is set to a fourth level (or a Vss level) lower than the third level. That is to say, a level of an analog input signal received at the analog input terminal 7 is changed in dependence on the selection of the switches 6a to 6d. The level of the analog input signal received at the analog input terminal 7 is converted into a digital value DV in the A/D converter 8, and the switch set in the on-state is recognized in the conventional one-chip microcomputer 1 according to the digital value DV.

In this case, an A/D conversion start request signal ADSTART is periodically transmitted from a central processing unit (CPU) of the conventional one-chip microcomputer 1 to the A/D converter 8 through the signal line 9 to set the A/D converter 8 to an operation state. When an analog input signal is received at the analog input terminal 7, the analog input signal is converted into a digital value in the A/D converter 8 in synchronization with one A/D conversion start request signal ADSTART. Thereafter, when the digital value is obtained, an A/D conversion finish signal ADF is output from the A/D converter 8 to the CPU through the signal line 11, and the digital value DV obtained in the A/D converter 8 is read out to the CPU through the data bus 10.

In the conventional one-chip microcomputer 1 with the A/D converter 8, the number of switches, which is possible to be connected to the analog input terminal 7 on condition that the on-off state of each switch can be recognized, depends on the resolution of the A/D converter 8. For example, in cases where the digital value output from the A/D converter 8 is indicated by 8-bit data, each of 256 (equal to $2^8$) switches, through which 256 analog signals are input to the conventional one-chip microcomputer 1, can be theoretically recognized.

However, in the conventional one-chip microcomputer 1 with the A/D converter 8, because the A/D converter 8 is periodically set to the operation state in response to the A/D conversion request signals ADSTART regardless of the reception of the analog input signal, the reception of the analog input signal or the switch relating to the analog input signal is not recognized until the digital value obtained from the analog input signal is sent to the CPU. Therefore, the A/D converter 8 is required to always monitor an analog signal sent from the analog input terminal 7 by periodically receiving the A/D conversion request signal ADSTART from the CPU, and it is required to always or intermittently set the A/D converter 8 to the operation state. Therefore, a problem has arisen that an electric power is consumed to always or intermittently set the A/D converter 8 to the operation state.

Also, to always or intermittently set the A/D converter 8 to the operation state, it is required to always operate the CPU from which the A/D conversion request signal ADSTART is periodically sent to the A/D converter 8 according to a clock signal output from a clock. Therefore, another problem has arisen that an electric power is consumed to always operate the CPU and the clock. Also, in cases where a plurality of analog input terminals 7 are arranged in the conventional one-chip microcomputer 1 with the A/D converter 8, a plurality of analog input signals received one after another at the analog input terminals 7 are processed in the A/D converter 8. In this case, it is difficult for the conventional one-chip microcomputer 1 to immediately recognize an analog input terminal 7 from which an analog input signal is sent. In detail, it is required to perform the A/D conversion in the A/D converter 8 while cyclically monitoring the analog input signals received at the analog input terminals 7. Therefore, it takes a judgment time Tj at least to recognize that an analog input signal is received at a specified analog input terminal 7.

$Tj$=(the number of analog input terminals 7)×($A/D$ conversion time+time for recognizing a digital value $DV$)

Therefore, in cases where a plurality of analog input terminals 7 are arranged in the conventional one-chip microcomputer 1, a problem has arisen that it takes a lot of time to recognize an analog signal received at each analog input terminal.

SUMMARY OF THE INVENTION

An object of the present invention is to provide, with due consideration to the drawbacks of the conventional one-chip microcomputer, a one-chip microcomputer with an analog-to-digital converter in which an analog input signal received at an analog input terminal or each of a plurality of analog input terminals is correctly and immediately recognized in a low electric power consumption.

The object is achieved by the provision of a one-chip microcomputer comprising an analog input terminal for receiving an analog input signal, an analog-to-digital conversion start request generating circuit for generating an analog-to-digital conversion start request signal in response to the analog input signal received in the analog input terminal, and an analog-to-digital converter for starting an analog-to-digital conversion in response to the analog-to-digital conversion start request signal generated in the analog-to-digital conversion start request generating circuit, and producing digital data from the analog input signal received in the analog input terminal in the analog-to-digital conversion.

In the above configuration, the A/D conversion start request generating circuit is immediately operated to merely output the A/D conversion start request signal of a high level in response to an analog input signal received in the analog input terminal. Also, the operation of the analog-to-digital (A/D) converter is immediately started in response to the A/D conversion start request signal sent from the A/D conversion start request generating circuit. Accordingly, the analog input signal received at the analog input terminal can be correctly and immediately recognized.

Also, because no operation of the A/D converter is required to receive a signal sent from a CPU of the one-chip microcomputer in the A/D converter for the purpose of the operation control of the A/D converter, it is not required to operate the A/D converter, the CPU or a clock for the purpose of instructing the A/D converter to wait for the analog input signal, but the CPU is operated only to receive the digital data from the A/D converter. Accordingly, the electric power consumed in the A/D converter, the A/D conversion start request generating circuit, the clock and the CPU of the one-chip microcomputer can be reduced.

It is preferred that the analog-to-digital conversion start request signal is generated in response to the analog input signal in the analog-to-digital conversion start request generating circuit on condition that the analog input signal has a significant level.

Because the analog-to-digital converter is not operated for the analog input signal of an insignificant level, the electric power consumed in the analog-to-digital converter, the clock and the CPU of the one-chip microcomputer can be further reduced.

The object is also achieved by the provision of a one-chip microcomputer comprising a plurality of analog input terminals for respectively receiving an analog input signal, a plurality of analog-to-digital conversion start request generating circuits, corresponding to the analog input terminals respectively, for respectively generating an analog-to-digital conversion start request signal in response to the analog input signal received in the corresponding analog input terminal, an analog input signal selecting circuit for detecting the analog-to-digital conversion start request signal generated in a particular analog-to-digital conversion start request generating circuit among the analog-to-digital conversion start request generating circuits, specifying the analog input terminal corresponding to the particular analog-to-digital conversion start request generating circuit and outputting the analog input signal received in the specified analog input terminal, and an analog-to-digital converter for starting an analog-to-digital conversion in response to the analog-to-digital conversion start request signal generated in the particular analog-to-digital conversion start request generating circuit and producing digital data from the analog input signal output from the analog input signal selecting circuit in the analog-to-digital conversion.

In the above configuration, when an analog-to-digital conversion start request signal is generated in a particular analog-to-digital conversion start request generating circuit in response to an analog input signal received at an analog input terminal corresponding to the particular analog-to-digital conversion start request generating circuit, the analog input terminal corresponding to the particular analog-to-digital conversion start request generating circuit is immediately specified in the analog input signal selecting circuit, and the analog input signal received at the analog input terminal corresponding to the particular analog-to-digital conversion start request generating circuit is immediately sent to the analog-to-digital converter through the analog input signal selecting circuit.

Accordingly, the analog input signal received at each analog input terminal can be correctly and immediately recognized in a low electric power consumption.

It is also preferred that the analog-to-digital conversion start request generating circuits have priorities, an analog-to-digital conversion start request signal is generated only in a particular analog-to-digital conversion start request generating circuit having a top priority among two analog-to-digital conversion start request generating circuits or more corresponding to two analog input terminals or more in cases where two analog input signals or more are simultaneously received at the analog input terminals respectively, and the analog-to-digital conversion start request signal generated in the particular analog-to-digital conversion start request generating circuit is sent to the analog-to-digital converter as the analog-to-digital conversion start request signal generated in the remarked analog-to-digital conversion start request generating circuit.

Therefore, even though two analog input signals or more are simultaneously received at two analog input terminals or more respectively, an analog-to-digital conversion start request signal is generated only in a particular analog-to-digital conversion start request generating circuit which has a top priority among two analog-to-digital conversion start request generating circuits or more corresponding to the two analog input terminals or more. Accordingly, the analog input signal received at the analog input terminal corresponding to the particular analog-to-digital conversion start request generating circuit can be reliably converted into digital data without erroneously recognizing the analog input terminal.

In this case, it is preferred that the particular analog-to-digital conversion start request generating circuit inhibits the two analog-to-digital conversion start request generating circuits or more other than the particular analog-to-digital conversion start request generating circuit from generating analog-to-digital conversion start request signals.

Therefore, analog input signals received at the analog input terminals corresponding to the analog-to-digital conversion start request generating circuits other than the particular analog-to-digital conversion start request generating circuit can be reliably disregarded.

It is preferred that an analog-to-digital conversion start request signal is generated only in a particular analog-to-digital conversion start request generating circuit among two analog-to-digital conversion start request generating circuits or more in cases where a particular analog input signal is earliest received at the analog input terminal corresponding to the particular analog-to-digital conversion start request generating circuit among two analog input signals or more respectively received at two analog input terminals or more corresponding to the two analog-to-digital conversion start request generating circuits or more, and the analog-to-digital conversion start request signal generated in the particular analog-to-digital conversion start request generating circuit is sent to the analog-to-digital converter as the analog-to-digital conversion start request signal generated in the remarked analog-to-digital conversion start request generating circuit.

Therefore, even though two analog input signals or more are received at two analog input terminals or more respectively, an analog-to-digital conversion start request signal is generated only in a particular analog-to-digital conversion start request generating circuit corresponding to the analog input terminal at which a particular analog input signal is earliest received. Accordingly, the particular analog input signal received at the analog input terminal corresponding to the particular analog-to-digital conversion start request generating circuit can be reliably converted into digital data without erroneously recognizing the analog input terminal.

In this case, it is preferred that the particular analog-to-digital conversion start request generating circuit inhibits the two analog-to-digital conversion start request generating circuits or more other than the particular analog-to-digital conversion start request generating circuit from generating analog-to-digital conversion start request signals.

Therefore, analog input signals received at the analog input terminals corresponding to the analog-to-digital conversion start request generating circuits other than the particular analog-to-digital conversion start request generating circuit can be reliably disregarded.

It is also preferred that the sending of the analog-to-digital conversion start request signal from the remarked analog-to-digital conversion start request generating circuit to the analog-to-digital converter is interrupted by the analog input signal selecting circuit in cases where two analog-to-digital conversion start request signals or more including the analog-to-digital conversion start request signal generated in the remarked analog-to-digital conversion start request generating circuit are simultaneously generated in two analog-to-digital conversion start request generating circuits or more including the remarked analog-to-digital conversion start request generating circuit.

Therefore, in cases where two analog input signals or more are simultaneously received at two analog input terminals or more respectively, the analog-to-digital conversion of the analog input signal received at the analog input terminal corresponding to the remarked analog-to-digital conversion start request generating circuit is not performed. Accordingly, the analog input signal received at the analog input terminal corresponding to the remarked analog-to-digital conversion start request generating circuit can be reliably converted into digital data without erroneously recognizing the analog input terminal.

It is also preferred that binary data indicating the analog input terminal corresponding to the remarked analog-to-digital conversion start request generating circuit is output from the analog input signal selecting circuit.

Therefore, the analog input terminal corresponding to the remarked analog-to-digital conversion start request generating circuit can be immediately recognized in the one-chip microcomputer. Also, even though a plurality of analog input signals having the same level are input one after another to a plurality of analog input terminals respectively, the analog input terminal corresponding to the remarked analog-to-digital conversion start request generating circuit can be immediately recognized in the one-chip microcomputer.

It is also preferred that the one-chip microcomputer further comprises an input circuit control register for inhibiting the generation of an analog-to-digital conversion start request signal in one analog-to-digital conversion start request generating circuit other than the remarked analog-to-digital conversion start request generating circuit.

Therefore, in cases where a user does not desire to receive digital data obtained from analog input signals received at an analog input terminal, the analog-to-digital conversion start request generating circuit corresponding to the analog input terminal can be inhibited from generating an analog-to-digital conversion start request signal. Accordingly, because the analog-to-digital converter is not operated for the analog input signals received at the analog input terminal, the electric power consumed in the one-chip microcomputer can be further reduced.

DETAILED DESCRIPTION OF THE PREFERRED EMBODIMENTS

Embodiments of the present invention will now be described with reference to the accompanying drawings.

Embodiment 1

Figure 1:
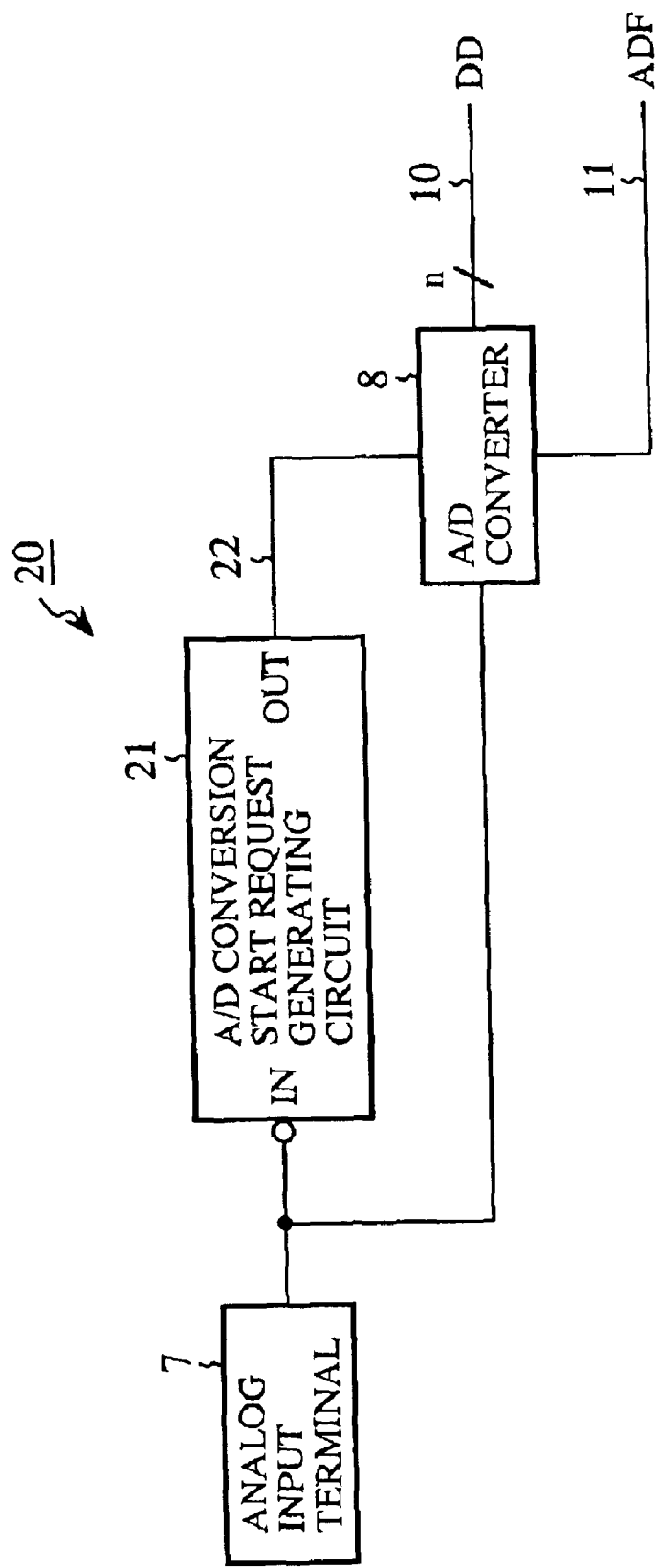
FIG. 1 is a circuit view showing a one-chip microcomputer with an A/D converter connected to an analog input terminal according to a first embodiment of the present invention.

FIG. 1 is a circuit view showing a one-chip microcomputer with an A/D converter connected to an analog input terminal according to a first embodiment of the present invention.

In FIG. 1, 20 indicates a one-chip microcomputer. 7 indicates an analog input terminal for receiving an analog input signal set to a level lower than a high (H) level. 21 indicates an A/D conversion start request generating circuit for judging whether or not the analog input signal received at the analog input terminal 7 is a significant signal having a significant level, and generating an A/D conversion start request signal in response to the analog input signal judged to be a significant signal. 22 indicates a signal line through which the A/D conversion start request signal generated in the A/D conversion start request generating circuit 21 is transmitted. 8 indicates an A/D converter for converting the analog input signal received at the analog input terminal 7 into digital data DD in response to the A/D conversion start request signal transmitted through the signal line 22. 11 indicates a signal line through which an A/D conversion finish signal ADF is sent from the A/D converter 8 to a CPU (not shown) of the one-chip microcomputer 20 when the A/D conversion performed in the A/D converter 8 in response to the A/D conversion start request signal is finished. 10 indicates a data bus through which the digital data produced in the A/D converter 8 is read out to the CPU in response to the reception of A/D conversion finish signal ADF.

Figure 2:
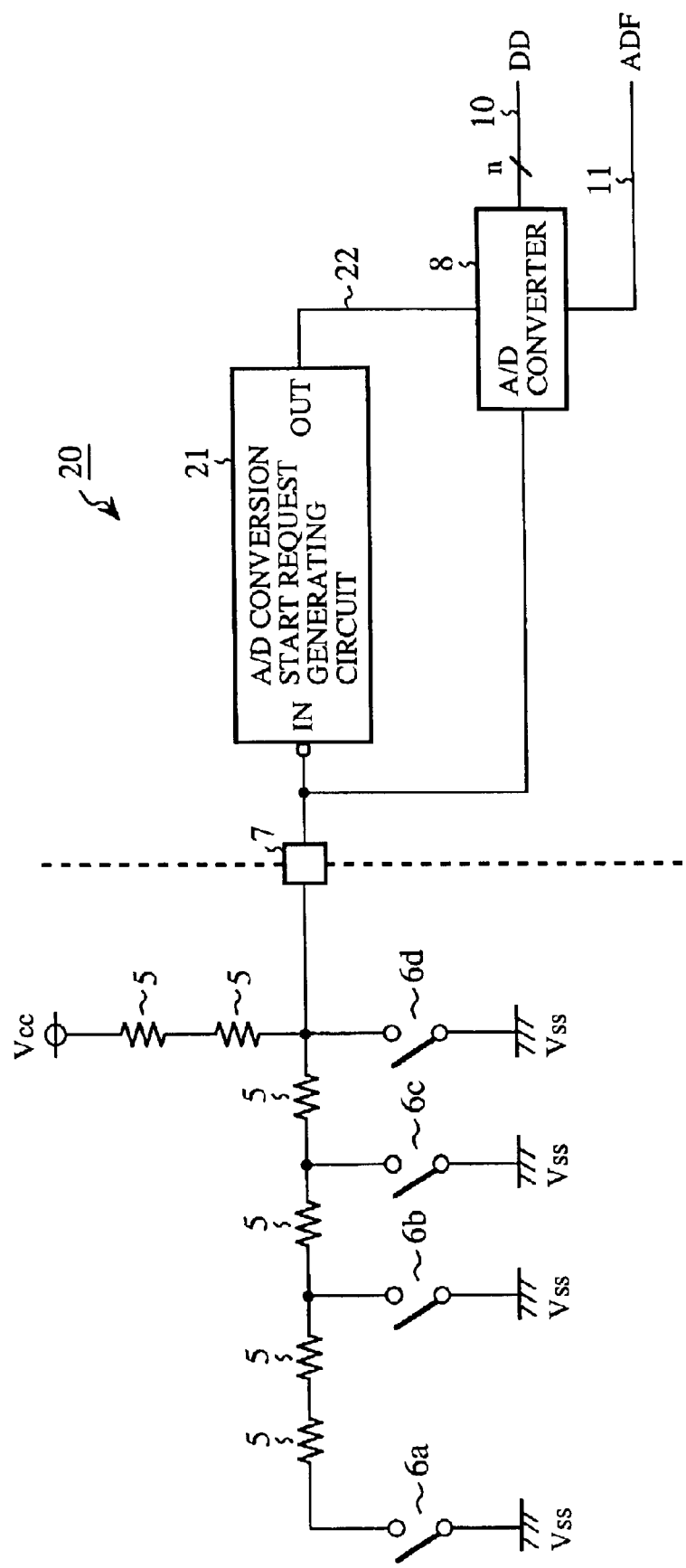
FIG. 2 is a circuit view showing both a one-chip microcomputer and an external switching circuit connected to an analog input terminal of the one-chip microcomputer according to the first embodiment of the present invention.

FIG. 2 is a circuit view showing both the one-chip microcomputer 20 and an external switching circuit connected to the analog input terminal 7 of the one-chip microcomputer 20 according to the first embodiment of the present invention.

Figure 11:
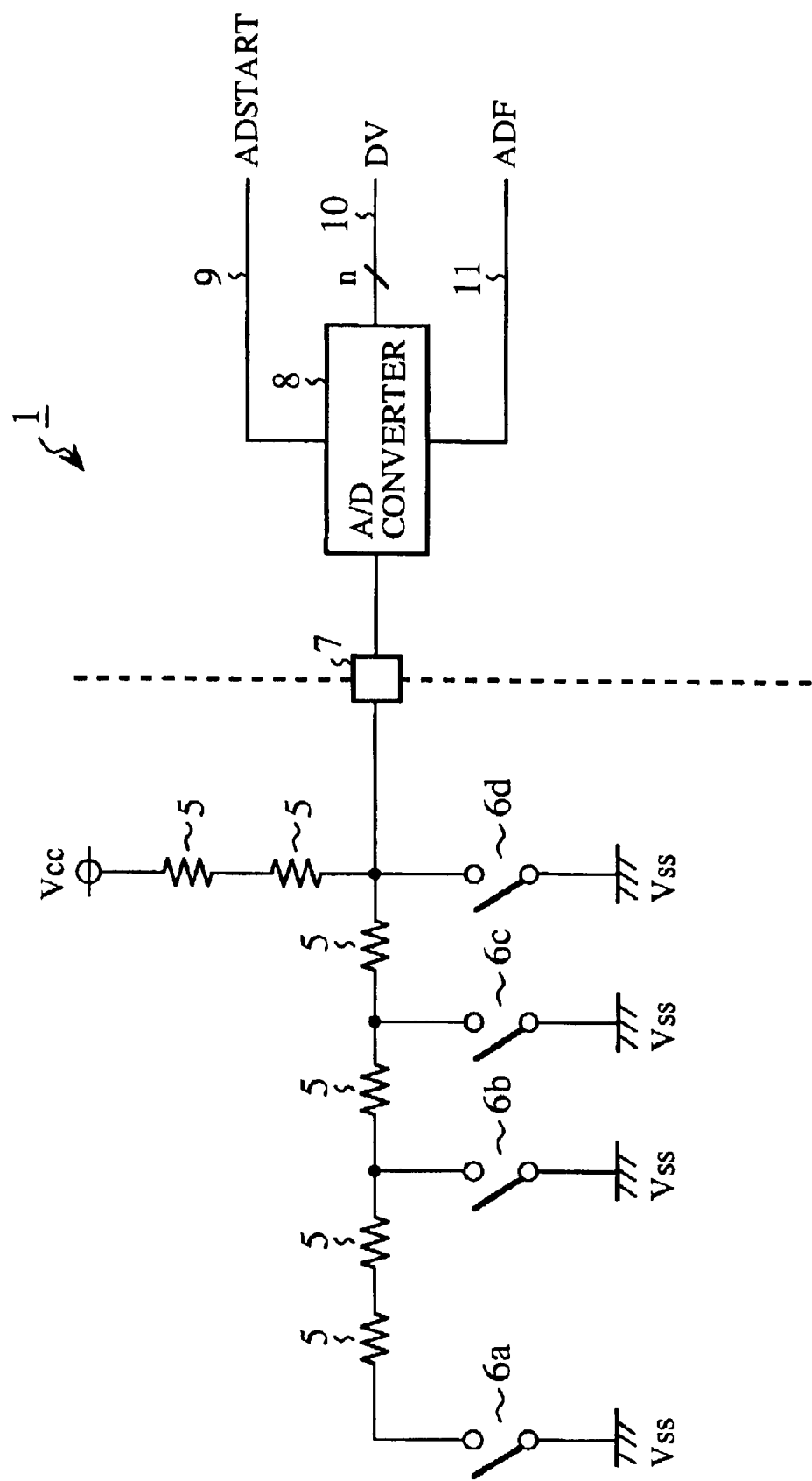
FIG. 11 is a circuit view showing a conventional one-chip microcomputer with an A/D converter connected to an external switching circuit.

In FIG. 2, 5 indicates each of the resistors, and 6a to 6d indicate the switches. The resistors 5 and the switches are arranged in the external switching circuit connected to an input circuit of the one-chip microcomputer in the same manner as those shown in FIG. 11. Therefore, the external switching circuit composed of the resistors 5 and the switches 6a to 6d are pull up to the H level (Vcc) before the switch operation, and each of the switches 6a to 6d is grounded to set the level of one terminal of the switch to the L level (Vss). In this specification, to simplify the description, Vss is preset to 0 V.

In the A/D conversion start request generating circuit 21, an analog input signal of a level equal to or lower than a prescribed threshold value of 0.6×Vcc is judged to be a significant signal having a significant level. Also, the analog input signal is judged in following embodiments in the same manner. Even though an analog input signal is received in the analog input terminal 7 and is sent to the A/D converter 8, the A/D converter 8 is not operated until an A/D conversion start request signal sent from the A/D conversion start request generating circuit 21 is received in the A/D converter 8. The A/D conversion finish signal ADF is a flag indicating the finish of the A/D conversion performed in the A/D converter 8. When the A/D conversion finish signal ADF is sent from the A/D converter 8 to the CPU through the signal line 11, a branch operation such as an interruption is performed in the CPU of the one-chip microcomputer 20 to receive digital data from the A/D converter 8.

Next, an operation of the one-chip microcomputer 20 will be described below.

When the switch 6a is set to an on-state, an input voltage Vin of an analog input signal at the analog input terminal 7 is expressed according to a following equation.

$$Vin = Vcc \times 4/6$$

$$\approx 0.66 \times Vcc$$

In this case, because the input voltage Vin is higher than the prescribed threshold value (0.6×Vcc) preset in the A/D conversion start request generating circuit 21, it is judged in the A/D conversion start request generating circuit 21 that the level of the analog input signal is an insignificant level, and no A/D conversion start request signal is generated in the A/D conversion start request generating circuit 21. Therefore, the A/D converter 8 is not operated regardless of the inputting of the analog input signal to the A/D converter 8.

Also, when the switch 6b is set to an on-state, an input voltage Vin of an analog input signal at the analog input terminal 7 is expressed according to a following equation.

$$Vin = Vcc \times 2/4$$

$$= 0.5 \times Vcc$$

In this case, because the input voltage Vin is lower than the prescribed threshold value (0.6×Vcc), it is judged in the A/D conversion start request generating circuit 21 that the analog input signal is a significant signal having a significant level, and an A/D conversion start request signal is generated in the A/D conversion start request generating circuit 21 and is sent to the A/D converter 8 through the signal line 22. Therefore, the operation of the A/D converter 8 is started to convert the analog input signal into digital data. Thereafter, when the A/D conversion from the analog input signal into the digital data is completed, an A/D conversion finish signal ADF is sent from the A/D converter 8 to the CPU through the signal line 11, and the digital data is read out from the A/D converter 8 to the CPU through the data bus 10 in response to the reception of the A/D conversion finish signal ADF in the CPU.

In the same manner, when each of the switch 6c and the switch 6d is set to an on-state, an input voltage Vin of an analog input signal at the analog input terminal 7 is lower than the prescribed threshold value. Therefore, it is judged that the analog input signal is a significant signal having a significant level, an A/D conversion start request signal is sent from the A/D conversion start request generating circuit 21 to the A/D converter 8, the operation of the A/D converter 8 is started to convert the analog input signal into digital data, and the digital data is read out from the A/D converter 8 to the CPU.

In this case, the input voltage Vin of the analog input signal at the analog input terminal 7 depends on the switch relating to the analog input signal. Therefore, the digital data DD indicating the value of the input voltage Vin of each analog input signal is checked in the CPU, and it is recognized in the one-chip microcomputer 20 which of the switches 6b to 6d is set to the on-state.

In this embodiment, the analog input signal obtained by setting the switch 6a to the on-state is judged to be an insignificant signal, and no digital data is sent to the CPU. The switch 6a is, for example, a fast replay switch of an audio replay device. In this device, when no replay operation is performed, an instruction of a fast replay operation is not available. Therefore, even though a user operates the fast replay switch 6a when no replay operation is performed, this switch operation is disregarded in this device. In contrast, when the device is set to the replay operation, the operation of the A/D conversion start request generating circuit 21 is halted so as to make the function of the one-chip computer 20 agree with that of the conventional one-chip computer 1 shown in FIG. 11. Therefore, when a user operates the switch 6a during the replay operation, the analog input signal relating to the switch 6a is converted into digital data in the A/D converter 8, and the fast replay operation is performed according to the digital data.

Also, in this embodiment, the external switching circuit composed of the resistors 5 and the switches 6a to 6d is pulled up to the H level before the switch operation, and each of the switches 6a to 6d is directly grounded. Therefore, in cases where the level of the analog input signal at the analog input terminal 7 is equal to or lower than the prescribed threshold value, it is judged that the analog input signal is a significant signal. However, it is applicable that the external switching circuit composed of the resistors 5 and the switches 6a to 6d be set to the L level before the switch operation. In this case, the connection of a connection terminal of the external switching circuit with the Vcc source is changed to the connection with the Vss source, the connection of connection terminals of the external switching circuit with the Vss source is changed to the connection with the Vcc source, and it is judged that the analog input signal at the analog input terminal 7 is a significant signal in cases where the level of the analog input signal is equal to or higher than 0.4×Vcc.

As is described above, in the first embodiment, no A/D conversion is performed in the A/D conversion start request generating circuit 21, but an A/D conversion start request signal denoting a flag is merely output from the A/D conversion start request generating circuit 21 in response to an analog input signal received in the analog input terminal 7. Therefore, an electric power consumed in the A/D conversion start request generating circuit 21 is very low. Also, the operation of the A/D converter 8 is started when an A/D conversion start request signal generated in the A/D conversion start request generating circuit 21 in response to an input analog signal is received in the A/D converter 8, and the operation of the A/D converter 8 is immediately stopped when digital data is produced from the analog input signal. Therefore, because it is not required that the A/D converter 8 is always or intermittently set in the operation state for the purpose of waiting for an analog input signal received at the analog input terminal 7, an electric power consumed in the A/D converter 8 is considerably reduced. Also, because it is not required to set the A/D converter 8 in the operation state for the purpose of waiting for an analog input signal, it is not required to send a control signal from the CPU of the one-chip microcomputer 20 to the A/D converter 8 for the purpose of always or intermittently setting the A/D converter 8 in the operation state. Therefore, it is not required to operate the CPU or the clock for the control of the A/D converter 8, but the CPU is operated only to receive the digital data from the A/D converter 8. Accordingly, the electric power consumed in the A/D converter 8, the A/D conversion start request generating circuit 21, the clock and the CPU of the one-chip microcomputer 20 can be reduced.

Also, because no A/D conversion start request signal is sent from the A/D conversion start request generating circuit 21 to the A/D converter 8 when an analog input signal of an insignificant level is received in the analog input terminal 7, the A/D converter 8 is not operated for the analog input signal of an insignificant level, and it is not required to operate the CPU for the reception of digital data relating to the analog input signal of an insignificant level. Therefore, the electric power consumed in the A/D converter 8, the clock and the CPU of the one-chip microcomputer 20 can be further reduced.

Embodiment 2

Figure 3:
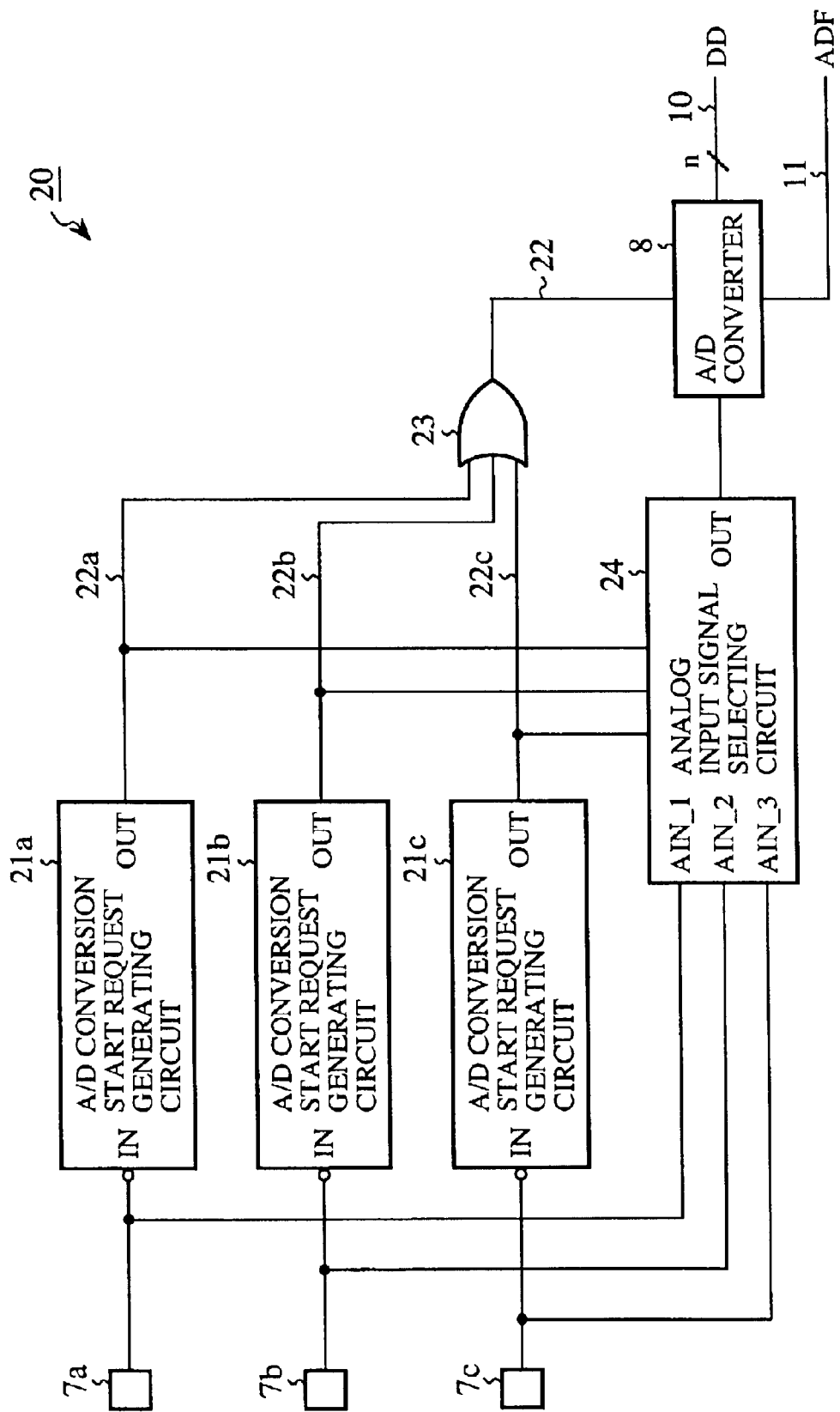
FIG. 3 is a circuit view showing a one-chip microcomputer with an A/D converter connected to a plurality of analog input terminals according to a second embodiment of the present invention.

FIG. 3 is a circuit view showing a one-chip microcomputer with an A/D converter connected to a plurality of analog input terminals according to a second embodiment of the present invention. The constituent elements, which are the same as those shown in FIG. 1, are indicated by the same reference numerals as those of the constituent elements shown in FIG. 1, and additional description of those constituent elements is omitted.

In FIG. 3, 7a to 7c indicate a plurality of analog input terminals for respectively receiving an analog input signal set to a level lower than the H level from the external switching circuit composed of the resistors 5 and the switched 6a to 6d.

21a to 21c indicate a plurality of A/D conversion start request generating circuits, connected to the analog input terminals 7a to 7c respectively, for respectively judging whether or not an analog input signal received at the corresponding analog input terminal 7a, 7b or 7c is a significant signal having a significant level, and generating an A/D conversion start request signal set to the H level in response to the analog input signal judged to be a significant signal.

22a to 22c indicate a plurality of signal lines. The A/D conversion start request signal generated in the A/D conversion start request generating circuit 21a, 21b or 21c is transmitted through the signal line 22a, 22b or 22c.

23 indicates a logical sum (OR) circuit for outputting an A/D conversion start signal to the signal line 22 in cases where the A/D conversion start request signal transmitted through at least one of the signal lines 22a to 22c is received.

24 indicates an analog input signal selecting circuit for detecting an A/D conversion start request signal output from one A/D conversion start request generating circuit 21a, 21b or 21c, specifying the analog input terminal 7a, 7b or 7c corresponding to the A/D conversion start request generating circuit 21a, 21b or 21c, from which the detected A/D conversion start request signal is output, according to the detected A/D conversion start request signal, selecting an analog input signal received in the specified analog input terminal and outputting to the selected analog input signal to the A/D converter 8.

Next, an operation of the one-chip microcomputer 20 will be described below.

When no analog input signal of a level equal to or lower than the prescribed threshold value (0.6×Vcc) is sent to the A/D conversion start request generating circuit 21a, 21b or 21c though the analog input terminal 7a, 7b or 7c, no A/D conversion start request signal set to the H level is output from the A/D conversion start request generating circuit 21a, 21b or 21c to the OR circuit 23. In this case, no A/D conversion start signal set to the H level is output from the OR circuit 23 to the A/D converter 8. Therefore, the A/D converter 8 is not operated.

In contrast, when an analog input signal of a level equal to or lower than the prescribed threshold value (0.6×Vcc) is sent to one of the A/D conversion start request generating circuits 21a, 21b and 21c though one of the analog input terminals 7a, 7b and 7c, an A/D conversion start request signal set to the H level is immediately output from the remarked A/D conversion start request generating circuit 21a, 21b or 21c, in which the analog input signal is received, to the OR circuit 23. Therefore, an A/D conversion start signal set to the H level is immediately output from the OR circuit 23 to the A/D converter 8. Also, the remarked analog input terminal 7a, 7b or 7c corresponding to the remarked A/D conversion start request generating circuit 21a, 21b or 21c is immediately specified in the analog input signal selecting circuit 24, and the analog input signal received at the remarked analog input terminal 7a, 7b or 7c is immediately sent to the A/D converter 8 through the analog input signal selecting circuit 24. In the A/D converter 8, the received analog input signal is immediately converted into digital data in response to the A/D conversion start signal sent from the OR circuit 23, the operation of the A/D converter 8 is stopped after the production of the digital data, and the digital data is read out to the CPU in response to the reception of the A/D conversion finish signal ADF in the same manner as in the first embodiment.

An example case where an analog input signal of a significant level is received at the analog input terminal 7a will be described.

When an analog input signal of a significant level is received at the analog input terminal 7a, the analog input signal is immediately sent to the A/D conversion start request generating circuit 21a. Because the analog input signal has a significant level, an A/D conversion start request signal set to the H level is immediately generated in the A/D conversion start request generating circuit 21a and is sent to the OR circuit 23 through the signal line 22a. In the OR circuit 23, because the signal set to the H level is received, an A/D conversion start signal set to the H level is immediately output. The A/D conversion start signal output from the OR circuit 23 is received in the A/D converter 8 through the signal line 22. Also, the A/D conversion start request signal transmitted through the signal line 22a is immediately detected in the analog input signal selecting circuit 24, the analog input terminal 7a corresponding to the A/D conversion start request generating circuit 21a, in which the detected A/D conversion start request signal is generated, is immediately specified in the analog input signal selecting circuit 24, and the analog input signal received at the analog input terminal 7a is immediately selected and sent to the A/D converter 8 through the analog input signal selecting circuit 24.

In the A/D converter 8, the received analog input signal is immediately converted into digital data in response to the A/D conversion start signal sent from the OR circuit 23. After the A/D conversion, an A/D conversion finish signal ADF is sent from the A/D converter 8 to the CPU, and the digital data is read out from the A/D converter 8 to the CPU in response to the A/D conversion finish signal ADF.

In this embodiment, because the external switching circuits connected to the analog input terminals 7a to 7c are pulled up to the H level before the switch operation, the analog input signal having a level equal to or lower than the prescribed threshold value (for example, 0.6×Vcc) is judged to be a significant signal. However, it is applicable that the analog input signal having a level equal to or higher than a prescribed threshold value (for example, 0.4×Vcc) is judged to be a significant signal by setting the external switching circuits to the L level before the switch operation.

As is described above, in the second embodiment, when an analog input signal having a significant level is received at one of the analog input terminals 7a to 7c, the analog input terminal 7a, 7b or 7c, at which the analog input signal is received, is correctly specified by the analog input signal selecting circuit 24, the analog input signal is immediately sent from the specified analog input terminal to the A/D converter 8, and an A/D conversion start signal is immediately sent to the A/D converter 8 in response to the analog input signal. Therefore, even though the one-chip microcomputer 20 has the plurality of analog input terminals 7a to 7c connected with the external switching circuits respectively, the analog input terminal, at which an analog input signal having a significant level is received, can be correctly and immediately specified, and the analog input signal can be reliably converted into digital data.

Also, in the same manner as in the first embodiment, the electric power consumed in the one-chip microcomputer 20 can be reduced.

In the second embodiment, for example, the analog input terminal, at which an analog input signal having a significant level is received, is recognize in the CPU of the one-chip microcomputer 20 according to digital data indicating a level of the analog input signal.

Embodiment 3

In the second embodiment, a plurality of analog input signals having significant levels are received one after another at the analog input terminals. In contrast, in a third embodiment, a plurality of analog input signals having significant levels are simultaneously received at a plurality of analog input terminals respectively.

Figure 4:
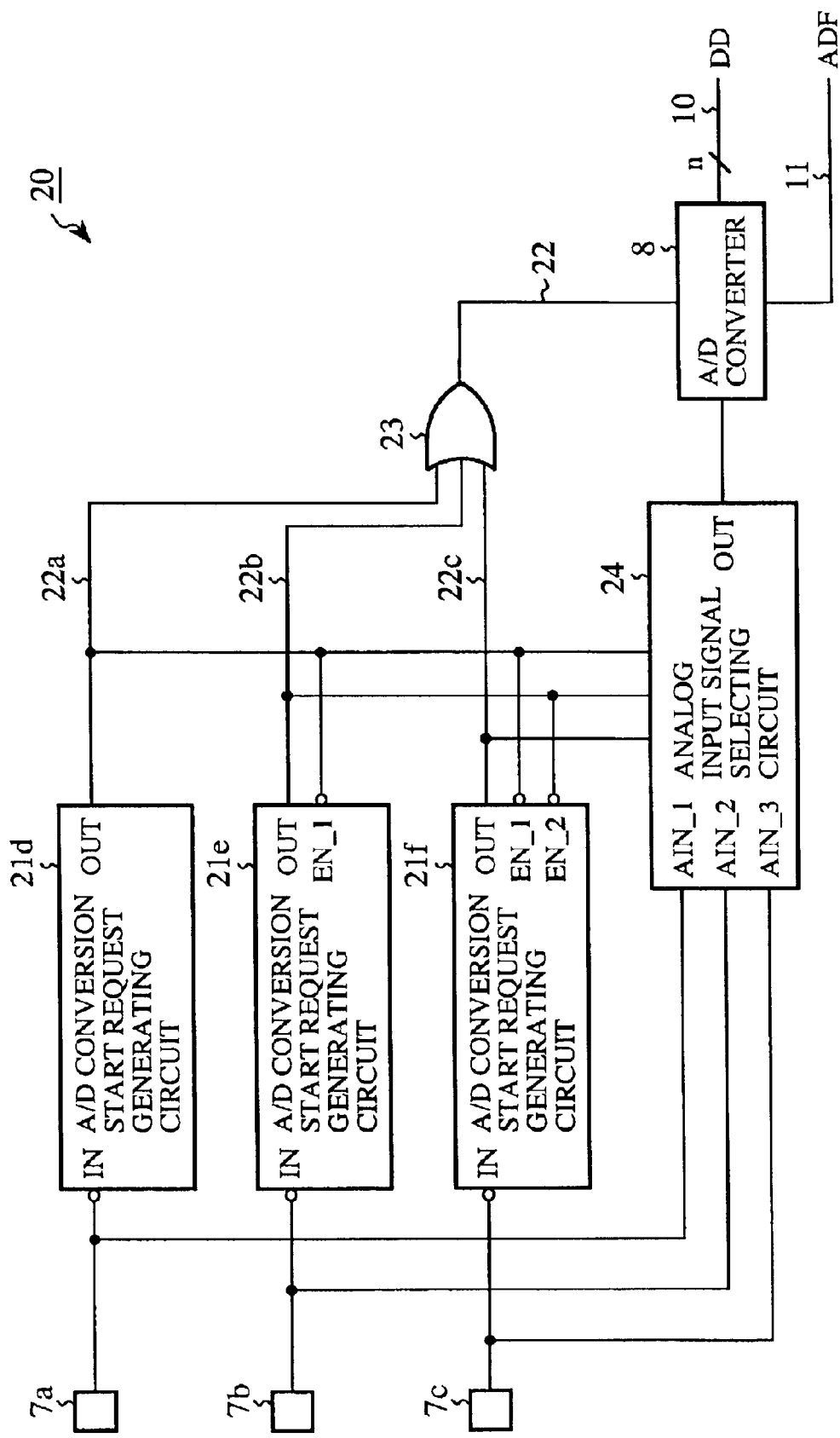
FIG. 4 is a circuit view showing a one-chip microcomputer with an A/D converter connected to a plurality of analog input terminals according to a third embodiment of the present invention.

FIG. 4 is a circuit view showing a one-chip microcomputer with an A/D converter connected to a plurality of analog input terminals according to a third embodiment of the present invention. The constituent elements, which are the same as those shown in FIG. 3, are indicated by the same reference numerals as those of the constituent elements shown in FIG. 3, and additional description of those constituent elements is omitted.

In FIG. 4, 21d indicates an A/D conversion start request generating circuit of a top priority for judging whether or not an analog input signal received at the analog input terminal 7a is a significant signal having a significant level, generating an A/D conversion start request signal set to the H level in response to the analog input signal judged to be a significant level, outputting the A/D conversion start request signal to the OR gate 23, and outputting the A/D conversion start request signal to other A/D conversion start request generating circuits as a signal generation inhibiting signal. The signal generation inhibiting signal indicates that an A/D conversion start request generating circuit receiving the signal generation inhibiting signal is inhibited from generating an A/D conversion start request signal.

21e indicates an A/D conversion start request generating circuit of a middle priority for judging whether or not an analog input signal received at the analog input terminal 7b is a significant signal having a significant level, generating an A/D conversion start request signal set to the H level in response to the analog input signal judged to be an significant level in cases where no signal generation inhibiting signal is received from the A/D conversion start request generating circuit 21d, outputting the A/D conversion start request signal to the OR gate 23, and outputting the A/D conversion start request signal to A/D conversion start request generating circuits other than the A/D conversion start request generating circuit 21d as a signal generation inhibiting signal.

21f indicates an A/D conversion start request generating circuit of a lowest priority for judging whether or not an analog input signal received at the analog input terminal 7c is a significant signal having a significant level, and generating an A/D conversion start request signal set to the H level in response to the analog input signal judged to be a significant level in cases where no signal generation inhibiting signal is received from the A/D conversion start request generating circuit 21d or 21e.

Next, an operation of the one-chip microcomputer 20 will be described below.

In cases where analog input signals of significant levels are simultaneously received at the analog input terminals 7a and 7b (or 7a and 7c) respectively, the analog input signals are immediately sent to the A/D conversion start request generating circuits 21d and 21e (or 21d and 21f). Because the analog input signal received in the A/D conversion start request generating circuit 21d has a significant level, an A/D conversion start request signal set to the H level is immediately generated in the A/D conversion start request generating circuit 21d and is sent to the OR circuit 23 through the signal line 22a, and an A/D conversion start signal is immediately sent from the OR circuit 23 to the A/D converter 8. Also, the A/D conversion start request signal of the A/D conversion start request generating circuit 21d is sent to the A/D conversion start request generating circuits 21e and 21f as a signal generation inhibiting signal.

In the A/D conversion start request generating circuit 21e (or 21f), though the analog input signal of a significant level is received through the analog input terminal 7b (or 7c), because the signal generation inhibiting signal is received from the A/D conversion start request generating circuit 21d, the generation of an A/D conversion start request signal is inhibited. Therefore, no A/D conversion start request signal is output from the A/D conversion start request generating circuit 21e (or 21f) to the signal line 22b (or 22c).

Also, the A/D conversion start request signal transmitted through the signal line 22a is immediately detected in the analog input signal selecting circuit 24, the analog input terminal 7a corresponding to the A/D conversion start request generating circuit 21d, in which the detected A/D conversion start request signal is generated, is immediately specified in the analog input signal selecting circuit 24, and the analog input signal received at the analog input terminal 7a is immediately sent to the A/D converter 8 through the analog input signal selecting circuit 24. In this case, because no A/D conversion start request signal is transmitted through the signal line 22b or 22c, even though the analog input signals of significant levels are simultaneously received at the analog input terminals 7a and 7b (or 7a and 7c) respectively, the analog input terminal 7a is correctly specified by the analog input signal selecting circuit 24.

Also, in cases where analog input signals of significant levels are simultaneously received at the analog input terminals 7b and 7c respectively, the analog input signals are immediately sent to the A/D conversion start request generating circuits 21e and 21f. Because the analog input signal received in the A/D conversion start request generating circuit 21e has a significant level and because no signal generation inhibiting signal of the A/D conversion start request generating circuit 21d is received in the A/D conversion start request generating circuit 21e, an A/D conversion start request signal set to the H level is immediately generated in the A/D conversion start request generating circuit 21e and is sent to the OR circuit 23 through the signal line 22a, and an A/D conversion start signal is immediately sent from the OR circuit 23 to the A/D converter 8. Also, the A/D conversion start request signal of the A/D conversion start request generating circuit 21e is sent to the A/D conversion start request generating circuit 21f as a signal generation inhibiting signal.

In the A/D conversion start request generating circuit 21f, though the analog input signal of a significant level is received through the analog input terminal 7c, because the signal generation inhibiting signal is received from the A/D conversion start request generating circuit 21e, the generation of an A/D conversion start request signal is inhibited. Therefore, no A/D conversion start request signal is output from the A/D conversion start request generating circuit 21f to the signal line 22c.

Also, the A/D conversion start request signal transmitted through the signal line 22b is immediately detected in the analog input signal selecting circuit 24, the analog input terminal 7b corresponding to the A/D conversion start request generating circuit 21e, in which the detected A/D conversion start request signal is generated, is immediately specified in the analog input signal selecting circuit 24, and the analog input signal received at the analog input terminal 7b is immediately sent to the A/D converter 8 through the analog input signal selecting circuit 24. In this case, because no A/D conversion start request signal is transmitted through the signal line 22a or 22c, even though the analog input signals of significant levels are simultaneously received at the analog input terminals 7b and 7c respectively, the analog input terminal 7b is correctly specified in the analog input signal selecting circuit 24.

Also, in cases where analog input signals of significant levels are simultaneously received at the analog input terminals 7a, 7b and 7c respectively, the analog input signals are immediately sent to the A/D conversion start request generating circuits 21d, 21e and 21e. Because the analog input signal received in the A/D conversion start request generating circuit 21d has a significant level, an A/D conversion start request signal set to the H level is immediately generated in the A/D conversion start request generating circuit 21d and is sent to the OR circuit 23 through the signal line 22a, and an A/D conversion start signal is immediately sent from the OR circuit 23 to the A/D converter 8. Also, the A/D conversion start request signal generated in the A/D conversion start request generating circuit 21d is sent to the A/D conversion start request generating circuits 21e and 21f as a signal generation inhibiting signal.

In each of the A/D conversion start request generating circuits 21e and 21f, though the analog input signal of a significant level is received through the analog input terminal 7b (or 7c), because the signal generation inhibiting signal is received from the A/D conversion start request generating circuit 21d, the generation of an A/D conversion start request signal is inhibited. Therefore, no A/D conversion start request signal is output from the A/D conversion start request generating circuit 21e or 21f to the signal line 22b or 22c.

Also, the A/D conversion start request signal transmitted through the signal line 22a is immediately detected in the analog input signal selecting circuit 24, the analog input terminal 7a corresponding to the A/D conversion start request generating circuit 21d, in which the detected A/D conversion start request signal is generated, is immediately specified in the analog input signal selecting circuit 24, and the analog input signal received at the analog input terminal 7a is immediately sent to the A/D converter 8 through the analog input signal selecting circuit 24. In this case, because no A/D conversion start request signal is transmitted through the signal line 22b or 22c, even though the analog input signals of significant levels are simultaneously received at the analog input terminals 7a, 7b and 7c respectively, the analog input terminal 7a is correctly specified in the analog input signal selecting circuit 24.

In short, the A/D conversion start request generating circuits 21d, 21e and 21f take priorities, the analog input signal of a significant level received at the analog input terminal 7a corresponding to the A/D conversion start request generating circuit 21d takes priority of the analog input signal of a significant level received at the analog input terminal 7b corresponding to the A/D conversion start request generating circuit 21e, and the analog input signal of a significant level received at the analog input terminal 7b corresponding to the A/D conversion start request generating circuit 21e takes priority of the analog input signal of a significant level received at the analog input terminal 7c corresponding to the A/D conversion start request generating circuit 21f. Therefore, in cases where a plurality of analog input signals having significant levels are received at a plurality of analog input terminals corresponding to a plurality of particular A/D conversion start request generating circuits, only the analog input signal, which is received at the analog input terminal corresponding to the particular A/D conversion start request generating circuit taking the top priority, is converted into digital data in the A/D converter 8.

As is described above, in the third embodiment, even though a plurality of analog input signals having significant levels are simultaneously received at a plurality of analog input terminals respectively, the analog input signal, which is received at the analog input terminal corresponding to the A/D conversion start request generating circuit taking the top priority, can be correctly and immediately recognized and converted into digital data.

Also, in the same manner as in the first embodiment, the electric power consumed in the one-chip microcomputer 20 can be reduced.

Figure 5:
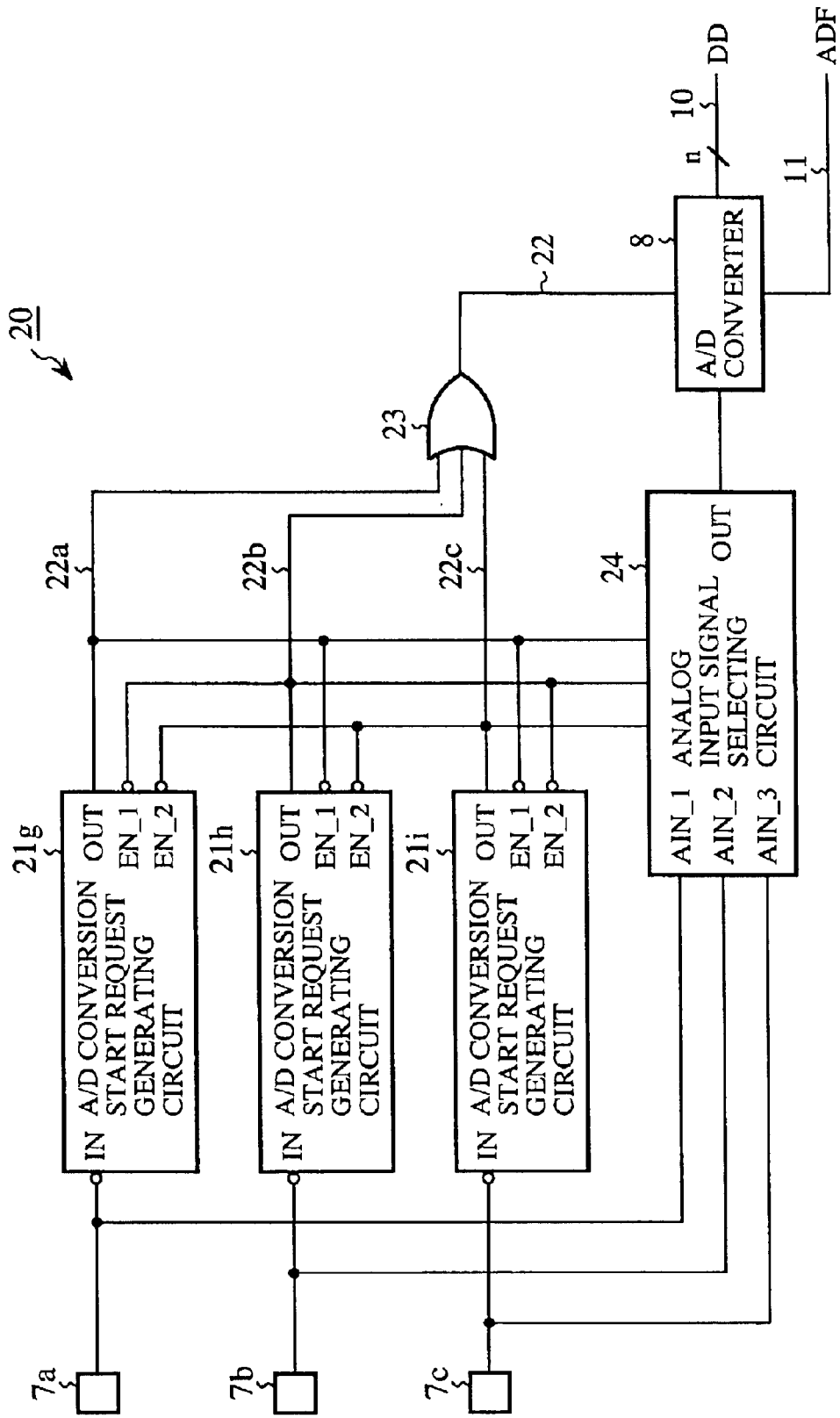
FIG. 5 is a circuit view showing a one-chip microcomputer with an A/D converter connected to a plurality of analog input terminals according to a first modification of the third embodiment of the present invention.

FIG. 5 is a circuit view showing a one-chip microcomputer with an A/D converter connected to a plurality of analog input terminals according to a first modification of the third embodiment of the present invention. In a first modification of the third embodiment, a plurality of analog input signals having significant levels are received one after another at the analog input terminals in the same manner as in the second embodiment.

The constituent elements, which are the same as those shown in FIG. 3, are indicated by the same reference numerals as those of the constituent elements shown in FIG. 3, and additional description of those constituent elements is omitted.

In FIG. 5, 21g to 21i indicate a plurality of A/D conversion start request generating circuits, connected to the analog input terminals 7a to 7c respectively, for respectively judging whether or not an analog input signal received at the corresponding analog input terminal 7a, 7b or 7c is a significant signal having a significant level, generating an A/D conversion start request signal set to the H level in response to the analog input signal judged to be a significant signal in cases where no signal generation inhibiting signals are received from the other A/D conversion start request generating circuits, outputting the A/D conversion start request signal to the OR circuit 23, and outputting the A/D conversion start request signal to the other A/D conversion start request generating circuits as a signal generation inhibiting signal.

Next, an operation of the one-chip microcomputer 20 will be described below.

In cases where an analog input signal of a significant level is earliest received at the analog input terminal 7a (or 7b or 7c) among a plurality of analog input signals received at the analog input terminals 7a, 7b and 7c, the analog input signal is immediately sent to the A/D conversion start request generating circuit 21g (or 21h or 21i). Because the analog input signal has a significant level and because no signal generation inhibiting signal is received in the A/D conversion start request generating circuit 21g (or 21h or 21i), an A/D conversion start request signal set to the H level is immediately generated in the A/D conversion start request generating circuit 21g (or 21h or 21i). The A/D conversion start request signal is sent to the OR circuit 23 through the signal line 22a (or 22b or 22c), and an A/D conversion start signal is immediately sent from the OR circuit 23 to the A/D converter 8. Also, the A/D conversion start request signal of the A/D conversion start request generating circuit 21g (or 21h or 21i) is sent as a signal generation inhibiting signal to the other A/D conversion start request generating circuits 21h and 21i (or 21g and 21i, or 21g and 21h).

In this case, in each of the A/D conversion start request generating circuits 21h and 21i (or 21g and 21i, or 21g and 21h), even though an analog input signal of a significant level is received through the corresponding analog input terminal after the reception of the earliest analog input signal in the A/D conversion start request generating circuit 21g (or 21h or 21i), because the signal generation inhibiting signal has been already received from the A/D conversion start request generating circuit 21g (or 21h or 21i), no A/D conversion start request signal is generated.

Also, the A/D conversion start request signal transmitted through the signal line 22a (or 22b or 22c) is immediately detected in the analog input signal selecting circuit 24, the analog input terminal 7a (or 7b or 7c) corresponding to the A/D conversion start request generating circuit 21g (or 21h or 21i), in which the detected A/D conversion start request signal is generated, is immediately specified in the analog input signal selecting circuit 24, and the analog input signal received at the analog input terminal 7a (or 7b or 7c) is immediately sent to the A/D converter 8 through the analog input signal selecting circuit 24. In this case, because no A/D conversion start request signal is transmitted through the signal line 22b or 22c (or 22a or 22c, or 22a or 22b), the analog input terminal 7a (or 7b or 7c) is further correctly specified in the analog input signal selecting circuit 24.

In short, even though a plurality of analog input signals having significant levels are received one after another at the plurality of analog input terminals 7a to 7c, the specific analog input signal earliest received among the analog input signals is converted into digital data in the A/D converter 8.

Thereafter, when the analog input signal is converted into digital data in the A/D converter 8, the digital data is sent to the CPU of the one-chip microcomputer 20 in the same manner as in the first embodiment, and the outputting of the signal generation inhibiting signal from the A/D conversion start request generating circuit 21g (or 21h or 21i) to the A/D conversion start request generating circuits 21h and 21i (or 21g and 21i, or 21g and 21h) is stopped. Therefore, when an analog input signal of a significant level is received in the A/D conversion start request generating circuits 21g, 21h or 21i through the analog input terminal 7a, 7b or 7c, the analog input signal can be converted into digital data in the A/D converter 8.

Accordingly, in the first modification of the third embodiment, even though a plurality of analog input signals having significant levels are received one after another at a plurality of analog input terminals respectively, the specific analog input signal earliest received among the analog input signals can be correctly and immediately recognized and converted into digital data.

In the first modification of the third embodiment, the outputting of the signal generation inhibiting signal from the A/D conversion start request generating circuit 21g (or 21h or 21i) to the other A/D conversion start request generating circuits 21h and 21i (or 21g and 21i, or 21g and 21h) is stopped after the sending of the digital data from the A/D converter 8 to the CPU of the one-chip microcomputer 20. However, it is applicable that an A/D conversion start request generating circuit earliest receiving an analog input signal of a significant level keep the outputting of the signal generation inhibiting signal to the other A/D conversion start request generating circuits. In this case, after the earliest reception of an analog input signal in the A/D conversion start request generating circuit 21g (or 21h or 21i), no analog input signal received at the analog input terminal 7b or 7c, (or 7a or 7c, or 7a or 7b) is converted into digital data. Also, it is applicable that an A/D conversion start request generating circuit earliest receiving an analog input signal of a significant level keep the outputting of the signal generation inhibiting signal to the other A/D conversion start request generating circuits during a prescribed time period.

Figure 6:
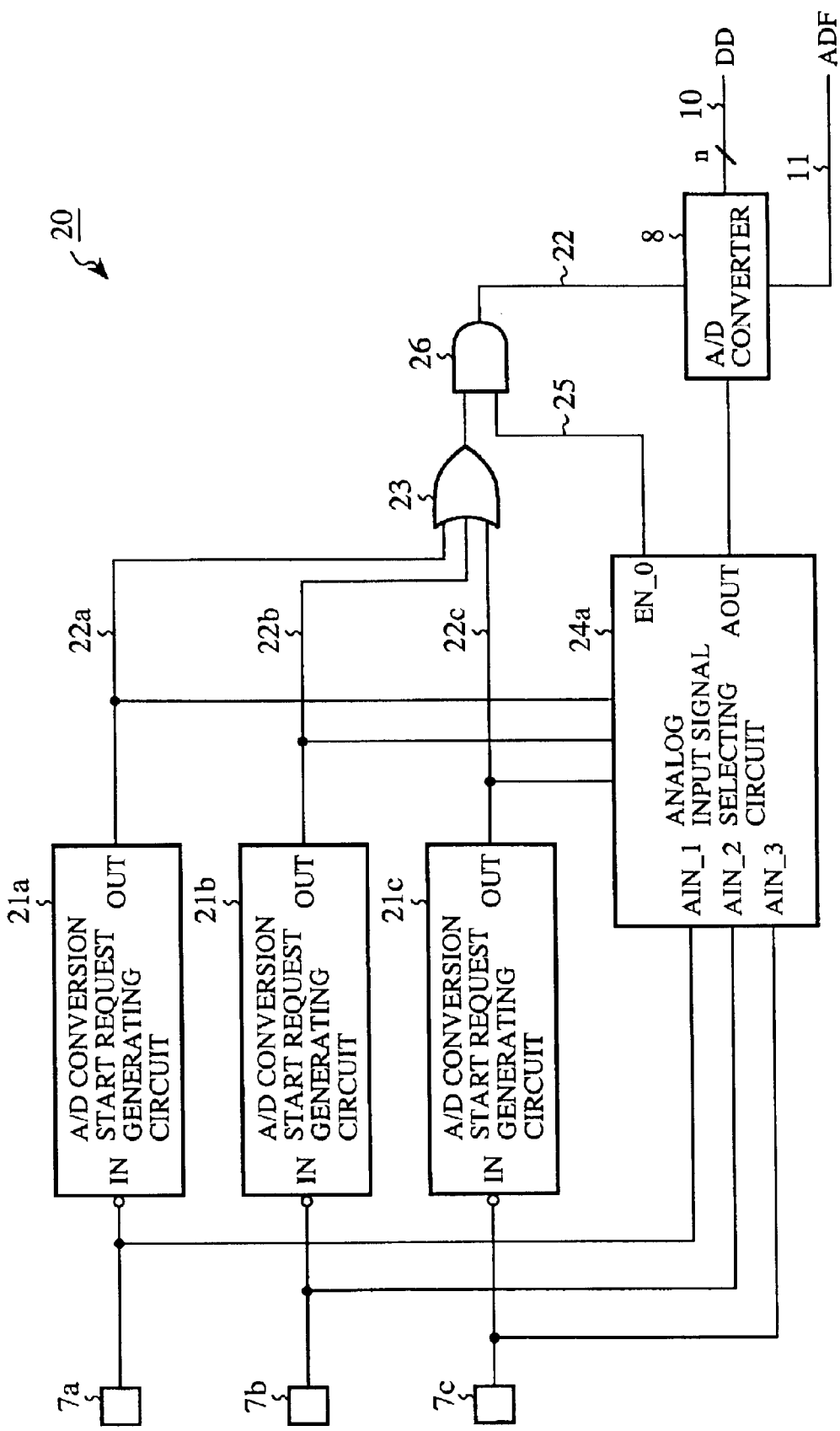
FIG. 6 is a circuit view showing a one-chip microcomputer with an A/D converter connected to a plurality of analog input terminals according to a second modification of the third embodiment of the present invention.

FIG. 6 is a circuit view showing a one-chip microcomputer with an A/D converter connected to a plurality of analog input terminals according to a second modification of the third embodiment of the present invention. In a second modification of the third embodiment, a plurality of analog input signals having significant levels are received simultaneously or one after another at the analog input terminals.

The constituent elements, which are the same as those shown in FIG. 3, are indicated by the same reference numerals as those of the constituent elements shown in FIG. 3, and additional description of those constituent elements is omitted.

In FIG. 6, 24a indicates an analog input signal selecting circuit for detecting an A/D conversion start request signal output from each of the A/D conversion start request generating circuits 21a, 21b and 21c, outputting an A/D conversion start interruption signal set to the L level in cases where two A/D conversion start request signals or more are simultaneously detected, specifying the analog input terminal 7a, 7b or 7c corresponding to the A/D conversion start request generating circuit 21a, 21b or 21c, from which the detected A/D conversion start request signal is output, in cases where only one A/D conversion start request signal is detected, outputting an A/D conversion start enabling signal set to the H level in cases where only one A/D conversion start request signal is detected, and outputting an analog input signal received in the specified analog input terminal to the A/D converter 8.

26 indicates a logical multiply (AND) circuit for outputting an A/D conversion start signal to the A/D converter 8 through the signal line 22 in cases where both an A/D conversion request signal of the H level output from the OR circuit 23 and the A/D conversion start enabling signal output from the analog input signal selecting circuit 24a are received.

25 indicates a signal line through which the A/D conversion start interruption signal or the A/D conversion start enabling signal is sent from the analog input signal selecting circuit 24a to the AND circuit 26.

Next, an operation of the one-chip microcomputer 20 will be described below.

In cases where a plurality of analog input signals simultaneously received in the two of the analog input terminals 7a to 7c or more are respectively input to two of the A/D conversion start request generating circuits 21a, 21b and 21c or more, a plurality of A/D conversion start request signals set to the H level are respectively output from the two of the A/D conversion start request generating circuits 21a, 21b and 21c or more and are input to the OR circuit 23. Therefore, an A/D conversion request signal set to the H level is sent from the OR circuit 23 to the AND circuit 26.

Also, the A/D conversion start request signals output from the two of the A/D conversion start request generating circuits 21a, 21b and 21c or more are detected in the analog input signal selecting circuit 24a. Because the number of detected A/D conversion start request signals is higher than one, an A/D conversion start interruption signal set to the L level is sent from the analog input signal selecting circuit 24a to the AND circuit 26 through the signal line 25 to prevent the AND circuit 26 from outputting an A/D conversion start signal set to the H level. Therefore, no A/D conversion start signal is sent from the AND circuit 26 to the A/D converter 8. As a result, the A/D converter 8 is not operated. In other words, the analog input signals simultaneously received in the two of the analog input terminals 7a to 7c or more are abandoned.

In contrast, in cases where an analog input signal received in one analog input terminal 7a, 7b or 7c is input to one A/D conversion start request generating circuit 21a, 21b or 21c, an A/D conversion start request signal set to the H level is output from the A/D conversion start request generating circuit 21a, 21b or 21c and is input to the OR circuit 23. Therefore, an A/D conversion request signal set to the H level is sent from the OR circuit 23 to the AND circuit 26. Also, the A/D conversion start request signal output from the A/D conversion start request generating circuit 21a, 21b or 21c is detected in the analog input signal selecting circuit 24a. Because only one A/D conversion start request signal is detected in the analog input signal selecting circuit 24a, an A/D conversion start enabling signal set to the H level is sent from the analog input signal selecting circuit 24a to the AND circuit 26 through the signal line 25 to permit the AND circuit 26 from outputting an A/D conversion start signal set to the H level. Therefore, an A/D conversion start signal set to the H level is sent from the AND circuit 26 to the A/D converter 8.

Also, the analog input terminal 7a, 7b or 7c corresponding to the A/D conversion start request generating circuit 21a, 21b or 21c, in which the detected A/D conversion start request signal is generated, is immediately specified in the analog input signal selecting circuit 24a in the same manner as that in the second embodiment, and the analog input signal received in the analog input terminal 7a, 7b or 7c is sent to the A/D converter 8 through the analog input signal selecting circuit 24a.

Therefore, the operation of the A/D converter 8 is started, and the analog input signal is converted into digital data in the same manner as in the second embodiment.

As is described above, in the second modification of the third embodiment, the A/D converter 8 is not operated in cases where a plurality of analog input signals are simultaneously received in the two of the analog input terminals 7a to 7c or more, but the operation of the A/D converter 8 is started in cases where only one analog input signal is received in the analog input terminal 7a, 7b or 7c. Accordingly, an erroneous selection of one analog input signal from a plurality of analog input signals can be prevented, and the A/D conversion can be performed only for the analog input signal correctly recognized.

Embodiment 4

In the second embodiment, information of an analog input terminal, at which an analog input signal converted into digital data in the A/D converter 8 is received, is not sent to the CPU of the one-chip computer. Therefore, the analog input terminal is recognize in the CPU according to the digital data indicating a specific level of the analog input signal. However, in cases where a plurality of analog input signals set to the same level are received one after another at the analog input terminals 7a to 7c, it is impossible to recognize an analog input terminal, at which an analog input signal is currently received, in the CPU. In a fourth embodiment, even though a plurality of analog input signals set to the same level are received one after another at the analog input terminals 7a to 7c, an analog input terminal, at which an analog input signal is currently received, is recognized in the CPU of the one-chip computer 20.

Figure 7:
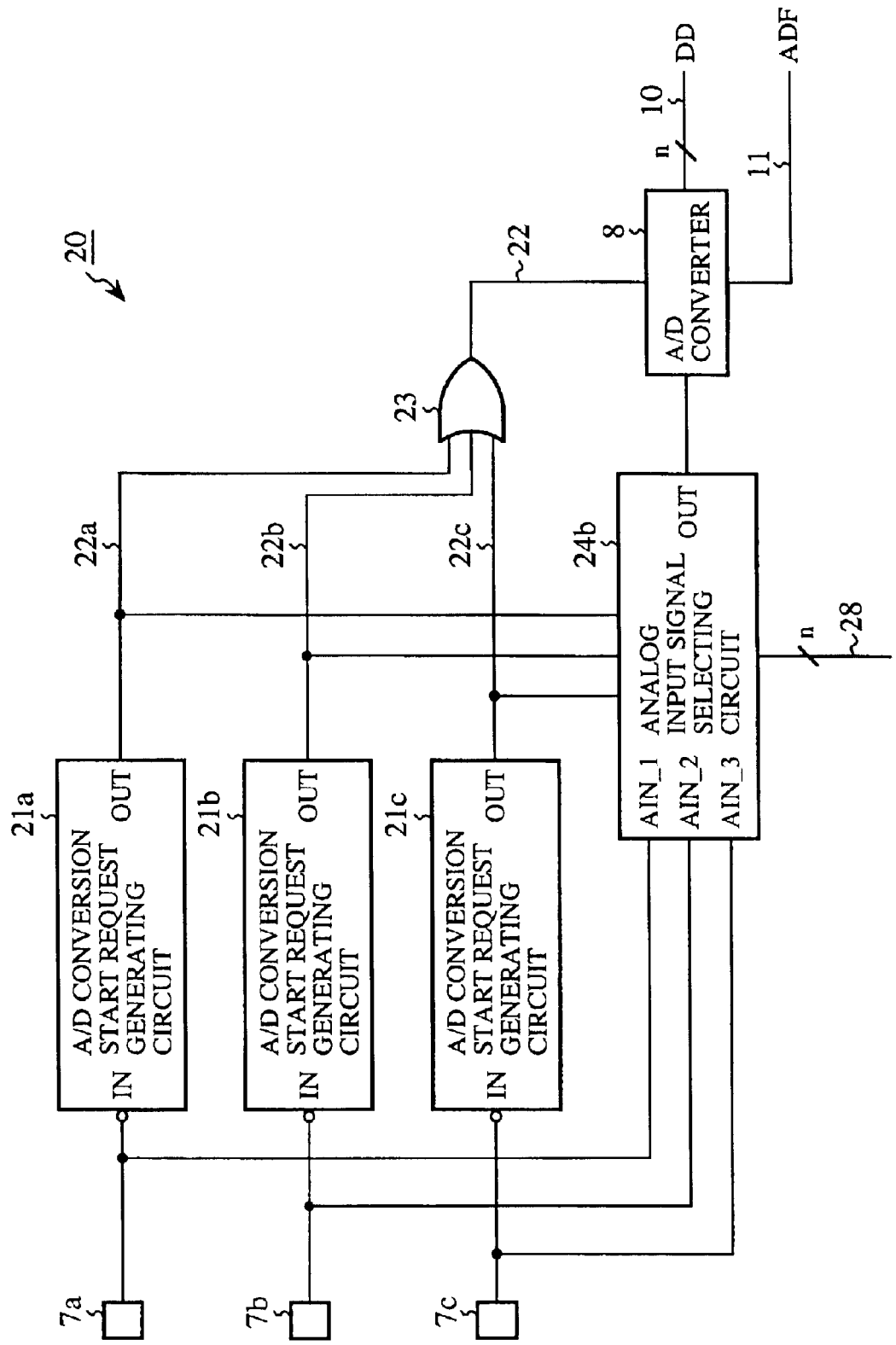
FIG. 7 is a circuit view showing a one-chip microcomputer with an A/D converter connected to a plurality of analog input terminals according to a fourth embodiment of the present invention.

FIG. 7 is a circuit view showing a one-chip microcomputer with an A/D converter connected to a plurality of analog input terminals according to a fourth embodiment of the present invention. The constituent elements, which are the same as those shown in FIG. 3, are indicated by the same reference numerals as those of the constituent elements shown in FIG. 3, and additional description of those constituent elements is omitted.

In FIG. 7, 24b indicates an analog input signal selecting circuit for detecting an A/D conversion start request signal of the H level output from one A/D conversion start request generating circuit 21a, 21b or 21c, specifying the analog input terminal 7a, 7b or 7c corresponding to the A/D conversion start request generating circuit 21a, 21b or 21c, from which the detected A/D conversion start request signal is output, according to the detected A/D conversion start request signal, outputting an analog input signal received in the specified analog input terminal to the A/D converter 8, and outputting binary data indicating the specified analog input terminal 7a, 7b or 7c to the CPU of the one-chip computer.

28 indicates a data bus through which the binary data indicating the specified analog input terminal 7a, 7b or 7c is sent from the analog input signal selecting circuit 24b to the CPU of the one-chip computer.

Next, an operation of the one-chip microcomputer 20 will be described below.

In the same manner as in the second embodiment, one analog input terminal 7a, 7b or 7c corresponding to one A/D conversion start request generating circuit 21a, 21b or 21c, in which an A/D conversion start request signal detected in the analog input signal selecting circuit 24b is generated, is specified in the analog input signal selecting circuit 24b, and an analog input signal of a significant level received at the specified analog input terminal 7a, 7b or 7c is sent to the A/D converter 8 through the analog input signal selecting circuit 24b. Also, binary data indicating the specified analog input terminal 7a, 7b or 7c is sent from the analog input signal selecting circuit 24b to the CPU of the one-chip computer 20 through the data bus 28.

As is described above, in the fourth embodiment, even though a plurality of analog input signals set to the same level are obtained in the external switching circuits and are received one after another at the analog input terminals 7a to 7c, because binary data indicating an analog input terminal, at which an analog input signal is currently received, is sent to the CPU of the one-chip computer 20 through the data bus 28, the analog input terminal corresponding to the analog input signal currently received can be correctly recognized in the CPU of the one-chip computer 20.

Also, even though the one-chip microcomputer 20 has the plurality of analog input terminals 7a to 7c connected with the external switching circuits respectively, the analog input signal received at each analog input terminal can be reliably converted into digital data in the same manner as in the third embodiment.

Also, in the same manner as in the first embodiment, the electric power consumed in the one-chip microcomputer 20 can be reduced.

Embodiment 5

In the second embodiment, an analog input signal received any analog input terminal is converted into digital data. However, there is a case where no analog input signal received at a specific analog input terminal is required. In a fifth embodiment, the A/D conversion is not performed for any analog input signal received at an analog input terminal specified in advance.

Figure 8:
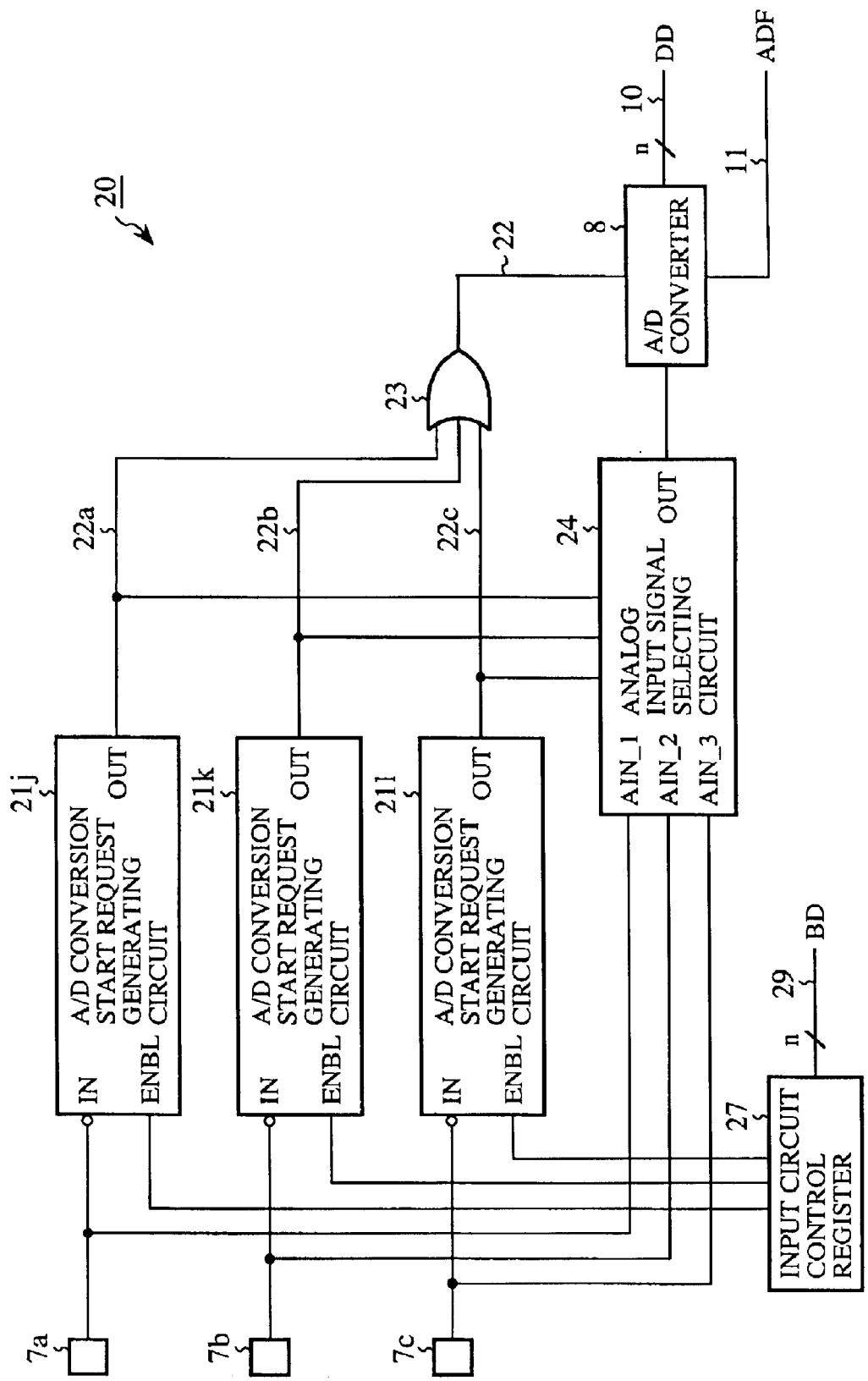
FIG. 8 is a circuit view showing a one-chip microcomputer with an A/D converter connected to a plurality of analog input terminals according to a fifth embodiment of the present invention.
Figure 9:
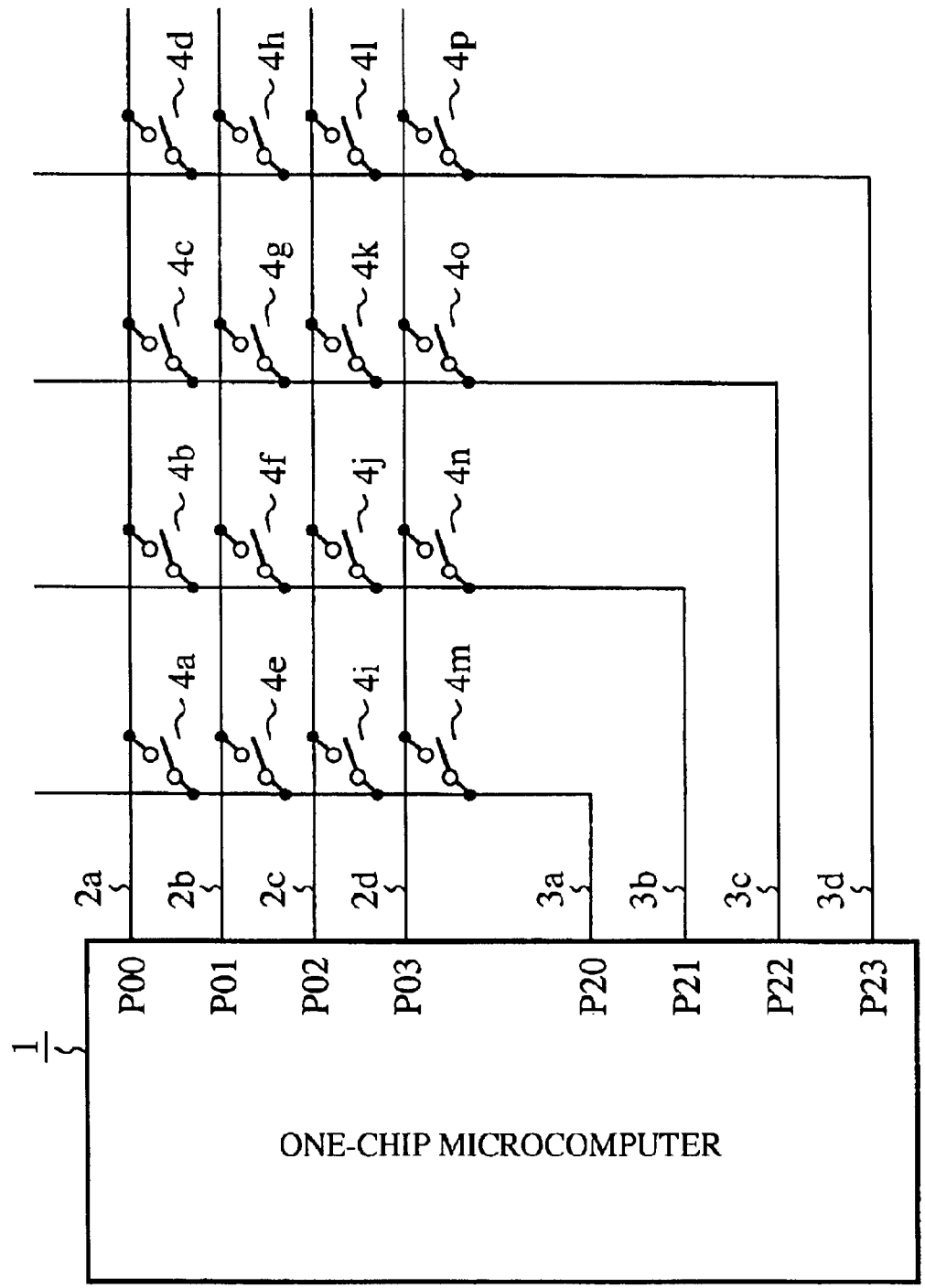
FIG. 9 is a circuit view showing a conventional one-chip microcomputer with a key matrix type input circuit.
Figure 10:
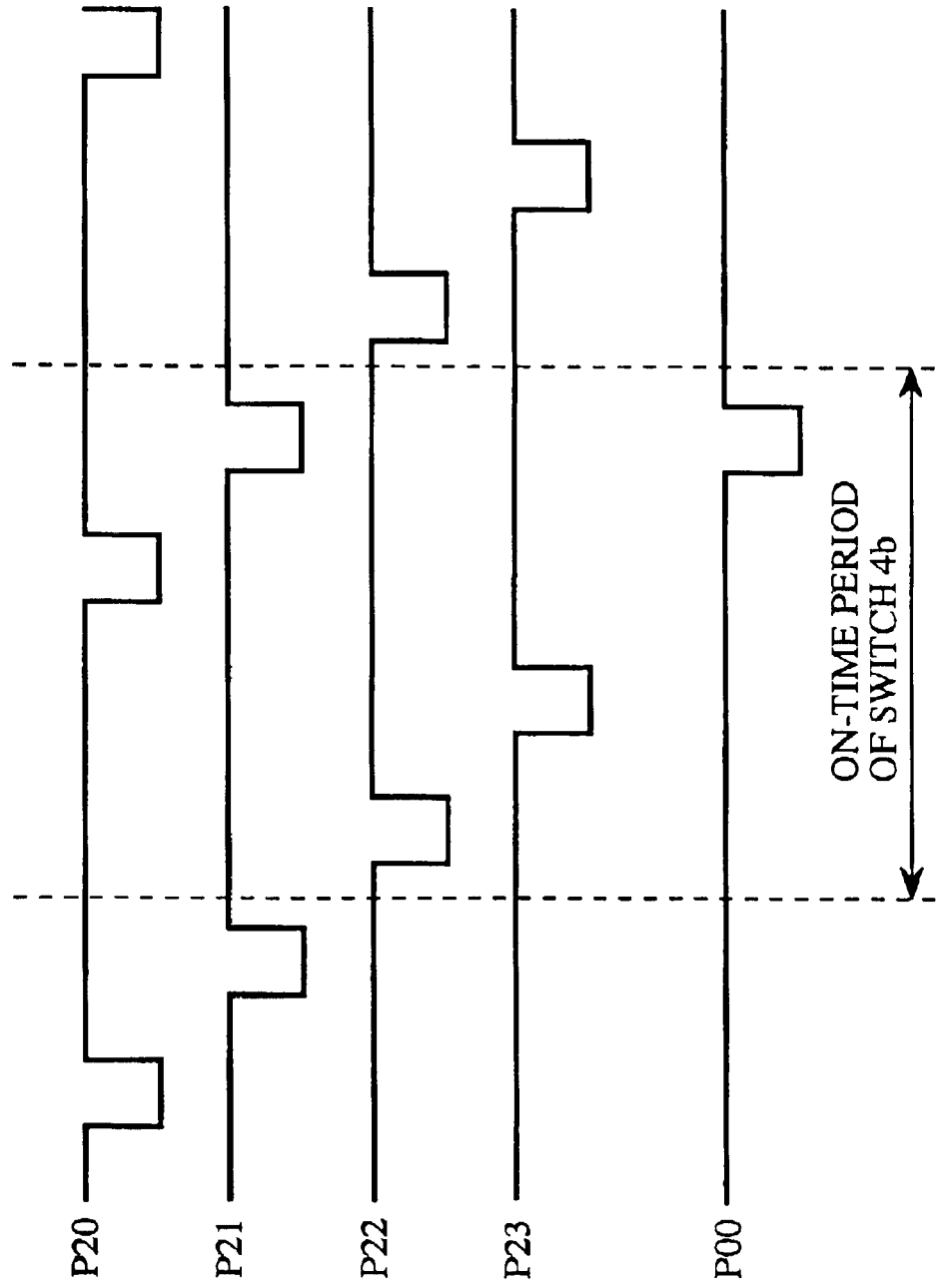
FIG. 10 is a timing chart showing an operation performed in the conventional one-chip microcomputer with the key matrix type input circuit.

FIG. 8 is a circuit view showing a one-chip microcomputer with an A/D converter connected to a plurality of analog input terminals according to a fourth embodiment of the present invention. The constituent elements, which are the same as those shown in FIG. 3, are indicated by the same reference numerals as those of the constituent elements shown in FIG. 3, and additional description of those constituent elements is omitted.

In FIG. 7, 21j, 21k and 21l indicate a plurality of A/D conversion start request generating circuits, connected to the analog input terminals 7a to 7c respectively, for respectively receiving either an operation enabling signal set to the H level or an operation inhibiting signal set to the L level at an enabling terminal ENBL, respectively judging whether or not an analog input signal received at the analog input terminal is a significant signal having a significant level on condition that the operation enabling signal is received, and generating an A/D conversion start request signal set to the H level in response to the analog input signal judged to be a significant signal.

27 indicates an input circuit control register for sending either the operation enabling signal or the operation inhibiting signal to the enabling terminal ENBL of each of the A/D conversion start request generating circuits 21j, 21k and 21l.

29 indicates a data bus through which operation setting binary data BD is sent from the CPU of the one-chip microcomputer 20 to the input circuit control register 27 to make the input circuit control register 27 produce either the operation enabling signal or the operation inhibiting signal for each A/D conversion start request generating circuit.

Next, an operation of the one-chip microcomputer 20 will be described below.

Operation setting binary data BD is sent in advance from the CPU of the one-chip microcomputer 20 to the input circuit control register 27. The operation setting binary data BD indicates the inhibition of an operation of an A/D conversion start request generating circuit or the inhibition of operations of a plurality of A/D conversion start request generating circuits. In the input circuit control register 27, either an operation enabling signal set to the H level or an operation inhibiting signal set to the L level is produced according to the operation setting binary data BD for each A/D conversion start request generating circuit. Thereafter, either the operation enabling signal or the operation inhibiting signal is sent to the enabling terminal ENBL of each A/D conversion start request generating circuit. Therefore, the operation of each A/D conversion start request generating circuit 21j, 21k or 21l, in which the operation inhibiting signal is received, is inhibited.

Thereafter, in cases where an analog input signal having a significant level is received at one analog input terminal 7a, 7b or 7c corresponding to one A/D conversion start request generating circuit 21j, 21k or 21l in which the operation inhibiting signal is received, no A/D conversion start request signal is produced in the A/D conversion start request generating circuit 21j, 21k or 21l. Therefore, the A/D converter 8 is not operated for the A/D conversion of the analog input signal.

In contrast, in cases where an analog input signal having a significant level is received at one analog input terminal 7a, 7b or 7c corresponding to one A/D conversion start request generating circuit 21j, 21k or 21l in which the operation enabling signal is received, an A/D conversion start request signal is produced in the A/D conversion start request generating circuit 21j, 21k or 21l. Therefore, in the same manner as in the second embodiment, the operation of the A/D converter 8 is started, and the analog input signal is converted into digital data.

As is described above, in the fifth embodiment, in cases where no analog input signal received at an analog input terminal is desired, the operation of the A/D conversion start request generating circuit corresponding to an undesired analog input terminal is inhibited in advance. Therefore, because the A/D converter 8 is not operated for any analog input signal received at the undesired analog input terminal, an electric power consumed in the A/D converter 8 can be reduced as compared with a case where digital data obtained from an analog input signal of the undesired analog input terminal is abandoned in the CPU of the one-chip microcomputer 20.

What is claimed is:

1. A one-chip microcomputer comprising:
    an analog input terminal for receiving an analog input signal;
    an analog-to-digital conversion start request generating circuit for generating an analog-to-digital conversion start request signal in response to the analog input signal received in the analog input terminal being higher than a predetermined threshold value; and an analog-to-digital converter for starting an analog-to-digital conversion in response to the analog-to-digital conversion start request signal generated in the analog-to-digital conversion start request generating circuit, and producing digital data from the analog input signal received in the analog input terminal in the analog-to-digital conversion.

2. A one-chip microcomputer comprising:

a plurality of analog input terminals for respectively receiving an analog input signal;

a plurality of analog-to-digital conversion start request generating circuits, corresponding to the analog input terminals respectively, for respectively generating an analog-to-digital conversion start request signal in response to the analog input signal received in the corresponding analog input terminal;

an analog input signal selecting circuit for detecting the analog-to-digital conversion start request signal generated in a remarked analog-to-digital conversion start request generating circuit among the analog-to-digital conversion start request generating circuits in cases where the analog input signal is received at the analog input terminal corresponding to the remarked analog-to-digital conversion start request generating circuit, specifying the analog input terminal corresponding to the remarked analog-to-digital conversion start request generating circuit, and outputting the analog input signal received in the specified analog input terminal; and an analog-to-digital converter for starting an analog-to-digital conversion in response to the analog-to-digital conversion start request signal generated in the remarked analog-to-digital conversion start request generating circuit, and producing digital data from the analog input signal output from the analog input signal selecting circuit in the analog-to-digital conversion.

3. A one-chip microcomputer according to claim 2, wherein the analog-to-digital conversion start request signal is generated in the remarked analog-to-digital conversion start request generating circuit in response to the analog input signal received at the corresponding analog input terminal on condition that the analog input signal has a significant level.

4. A one-chip microcomputer according to claim 2, wherein the analog-to-digital conversion start request generating circuits have priorities, an analog-to-digital conversion start request signal is generated only in a particular analog-to-digital conversion start request generating circuit having a top priority among two analog-to-digital conversion start request generating circuits or more corresponding to two analog input terminals or more in cases where two analog input signals or more are simultaneously received at the analog input terminals respectively, and the analog-to-digital conversion start request signal generated in the particular analog-to-digital conversion start request generating circuit is sent to the analog-to-digital converter as the analog-to-digital conversion start request signal generated in the remarked analog-to-digital conversion start request generating circuit.

5. A one-chip microcomputer according to claim 4, wherein the particular analog-to-digital conversion start request generating circuit inhibits the two analog-to-digital conversion start request generating circuits or more other than the particular analog-to-digital conversion start request generating circuit from generating analog-to-digital conversion start request signals.

6. A one-chip microcomputer according to claim 2, wherein an analog-to-digital conversion start request signal is generated only in a particular analog-to-digital conversion start request generating circuit among two analog-to-digital conversion start request generating circuits or more in cases where a particular analog input signal is earliest received at the analog input terminal corresponding to the particular analog-to-digital conversion start request generating circuit among two analog input signals or more respectively received at two analog input terminals or more corresponding to the two analog-to-digital conversion start request generating circuits or more, and the analog-to-digital conversion start request signal generated in the particular analog-to-digital conversion start request generating circuit is sent to the analog-to-digital converter as the analog-to-digital conversion start request signal generated in the remarked analog-to-digital conversion start request generating circuit.

7. A one-chip microcomputer according to claim 6, wherein the particular analog-to-digital conversion start request generating circuit inhibits the two analog-to-digital conversion start request generating circuits or more other than the particular analog-to-digital conversion start request generating circuit from generating analog-to-digital conversion start request signals.

8. A one-chip microcomputer according to claim 2, wherein the sending of the analog-to-digital conversion start request signal from the remarked analog-to-digital conversion start request generating circuit to the analog-to-digital converter is interrupted by the analog input signal selecting circuit in cases where two analog-to-digital conversion start request signals or more including the analog-to-digital conversion start request signal generated in the remarked analog-to-digital conversion start request generating circuit are simultaneously generated in two analog-to-digital conversion start request generating circuits or more including the remarked analog-to-digital conversion start request generating circuit.

9. A one-chip microcomputer according to claim 2, wherein binary data indicating the analog input terminal corresponding to the remarked analog-to-digital conversion start request generating circuit is output from the analog input signal selecting circuit.

10. A one-chip microcomputer according to claim 2, further comprising:

an input circuit control register for inhibiting the generation of an analog-to-digital conversion start request signal in one analog-to-digital conversion start request generating circuit other than the remarked analog-to-digital conversion start request generating circuit.

* * * * *